US008648431B2

(12) United States Patent
Abe et al.

(10) Patent No.: US 8,648,431 B2
(45) Date of Patent: Feb. 11, 2014

(54) ACOUSTIC SEMICONDUCTOR DEVICE

(75) Inventors: Kazuhide Abe, Kanagawa-ken (JP); Tadahiro Sasaki, Tokyo (JP); Atsuko Iida, Kanagawa-ken (JP); Kazuhiko Itaya, Kanagawa-ken (JP); Takashi Kawakubo, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 156 days.

(21) Appl. No.: 13/220,116

(22) Filed: Aug. 29, 2011

(65) Prior Publication Data

US 2012/0241877 A1 Sep. 27, 2012

(30) Foreign Application Priority Data

Mar. 23, 2011 (JP) ................................. 2011-064855

(51) Int. Cl.
H01L 29/84 (2006.01)

(52) U.S. Cl.
USPC ........... 257/416; 257/245; 257/254; 257/277; 257/531; 257/E29.324; 381/163; 381/337; 381/357

(58) Field of Classification Search
None
See application file for complete search history.

(56) References Cited

U.S. PATENT DOCUMENTS 3,414,832 A * 12/1968 Newell ........................ 330/286
3,792,321 A * 2/1974 Seifert ........................ 257/416
7,796,710 B2 9/2010 Abe et al.
7,851,833 B2 12/2010 Abe et al.
2008/0258815 A1 10/2008 Abe et al.
2009/0134430 A1 5/2009 Abe et al.

FOREIGN PATENT DOCUMENTS

| JP | 5-37287 A | 2/1993 |
| JP | 7-203593 A | 8/1995 |
| JP | 2002-209299 A | 7/2002 |
| JP | 2004-534473 A | 11/2004 |
| WO | WO 2008/016075 A1 | 2/2008 |

OTHER PUBLICATIONS

U.S. Appl. No. 12/873,788, filed Sep. 1, 2010, Kazuhide Abe, et al.
Gabriel Weinreich, "Acoustodynamic Effects in Semiconductors", Physical Review, vol. 104, No. 2, 1956, pp. 321-324.
Office Action issued Nov. 12, 2012, in Japanese Patent Application No. 2011-064855 with English translation.
U.S. Appl. No. 13/685,859, filed Nov. 27, 2012, Abe et al.

* cited by examiner

Primary Examiner — Yasser A Abdelaziez
(74) Attorney, Agent, or Firm — Oblon, Spivak, McClelland, Maier & Neustadt, L.L.P.

(57) ABSTRACT

According to one embodiment, an acoustic semiconductor device includes an element unit, and a first terminal. The element unit includes an acoustic resonance unit. The acoustic resonance unit includes a semiconductor crystal. An acoustic standing wave is excitable in the acoustic resonance unit and is configured to be synchronously coupled with electric charge density within at least one portion of the semiconductor crystal via deformation-potential coupling effect. The first terminal is electrically connected to the element unit. At least one selected from outputting and inputting an electrical signal is implementable via the first terminal. The electrical signal is coupled with the electric charge density. The outputting the electrical signal is from the acoustic resonance unit, and the inputting the electrical signal is into the acoustic resonance unit.

19 Claims, 21 Drawing Sheets

ACOUSTIC SEMICONDUCTOR DEVICE

CROSS-REFERENCE TO RELATED APPLICATIONS

This application is based upon and claims the benefit of priority from the prior Japanese Patent Application No. 2011-64855, filed on Mar. 23, 2011; the entire contents of which are incorporated herein by reference.

FIELD

Embodiments described herein relate generally to an acoustic semiconductor device.

BACKGROUND

An inductor is one of the basic elements of electronic circuits. Inductors are widely used in choke coils, resonant circuits, tuning circuits, transformers, various sensors, wireless power circuits, modems, impedance matching circuits, frequency filters, oscillator circuits, etc.

Because it is necessary to increase the number of coil windings to realize an inductor having a large inductance, downsizing of the element is difficult.

There is a need for a novel inductor element having a large inductance.

DETAILED DESCRIPTION

Figure 1A:
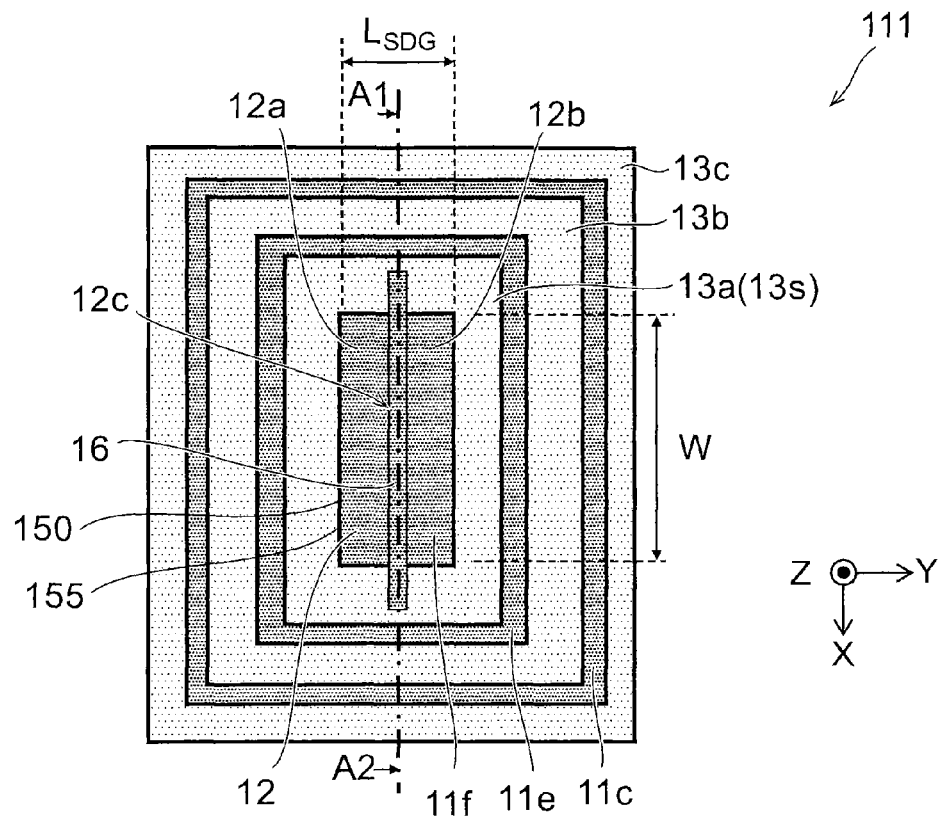
FIG. 1A and FIG. 1B are schematic views illustrating the configuration of an acoustic semiconductor device according to the first embodiment.

In general, according to one embodiment, an acoustic semiconductor device includes an element unit, and a first terminal. The element unit includes an acoustic resonance unit. The acoustic resonance unit includes a semiconductor crystal. An acoustic standing wave is excitable in the acoustic resonance unit and is configured to be synchronously coupled with electric charge density within at least one portion of the semiconductor crystal via deformation-potential coupling effect. The first terminal is electrically connected to the element unit. At least one selected from outputting and inputting an electrical signal is implementable via the first terminal. The electrical signal is coupled with the electric charge density. The outputting the electrical signal is from the acoustic resonance unit, and the inputting the electrical signal is into the acoustic resonance unit.

Various embodiments will be described hereinafter with reference to the accompanying drawings.

The drawings are schematic and conceptual; and the relationships between the thickness and width of portions, the proportions of sizes among portions, etc., are not necessarily the same as the actual values thereof. Further, the dimensions and proportions may be illustrated differently among drawings, even for identical portions.

In the specification and drawings, components similar to those described or illustrated in a drawing thereinabove are marked with like reference numerals, and a detailed description is omitted as appropriate.

First Embodiment

Figure 1B:
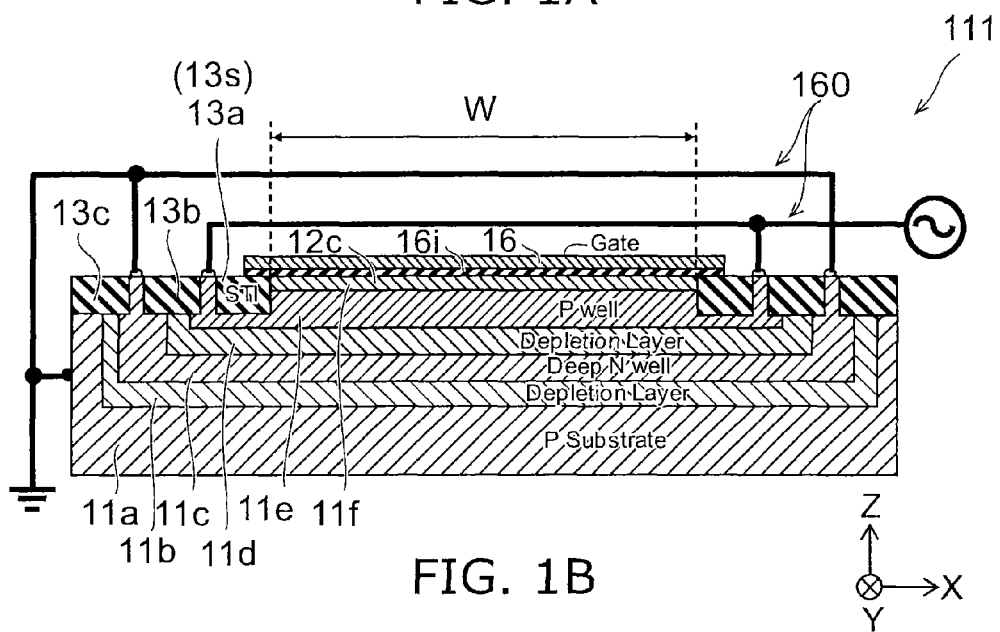

FIG. 1A and FIG. 1B are schematic views illustrating the configuration of an acoustic semiconductor device according to the first embodiment.

FIG. 1A is a schematic plan view. FIG. 1B is a schematic cross-sectional view corresponding to the cross section along line A1-A2 of FIG. 1A.

As illustrated in FIG. 1A and FIG. 1B, the acoustic semiconductor device 111 according to this embodiment includes an element unit 150 and a first terminal 160.

The element unit 150 includes a semiconductor crystal. The element unit 150 includes an acoustic resonance unit 155 in which an acoustic standing wave is excitable. The acoustic standing wave is synchronously coupled with electric charge density at least one portion of the semiconductor crystal via deformation-potential coupling effect. For example, the acoustic resonance unit 155 includes the semiconductor crystal. The first terminal 160 is electrically connected to the element unit 150.

It is possible to output an electrical signal synchronous with the acoustic standing wave recited above from the acoustic resonance unit 155 via the first terminal 160. It is possible to input the electrical signal synchronous with the acoustic standing wave recited above to the acoustic resonance unit 155. For example, the electrical signal is coupled with the electric charge density. For example, the electrical signal is coupled with the electric charge density through at least one selected from a dynamical outputting of electric charge and a dynamical inputting of electric charge between the first terminal and the semiconductor crystal.

In this example, a configuration similar to that of a field effect transistor is used as the element unit 150. For example, as illustrated in FIG. 1A and FIG. 1B, an element region 12 is provided on a p-type substrate 11a. An element-separating unit 13s is provided around the element region 12.

For example, a depletion layer 11b is provided on the p-type substrate 11a; and a deep N-well layer 11c is provided on the depletion layer 11b. A depletion layer 11d is provided on the deep N-well layer 11c; and a P-well layer 11e is provided on the depletion layer 11d. A P-well region 11f is provided on the P-well layer 11e. An insulating layer 16i is provided on the P-well region 11f; and a gate electrode 16 is provided on the insulating layer 16i. In this example, a first element-separating region 13a is provided around the P-well region 11f; a second element-separating region 13b is provided around the P-well layer 11e; and a third element-separating region 13c is provided around the deep N-well layer 11c.

Herein, for convenience of description, a direction from the p-type substrate 11a toward the gate electrode 16 is taken as a Z-axis direction. One axis perpendicular to the Z-axis is taken as an X-axis. An axis perpendicular to the Z-axis and the X-axis is taken as a Y-axis. The extension axis of the gate electrode 16 is taken to be the X-axis.

In other words, the acoustic resonance unit 155 includes a semiconductor crystal resonance layer. The semiconductor crystal resonance layer includes a first impurity diffusion portion 12a (e.g., a source region), a second impurity diffusion portion 12b (a drain region), and an intermediate portion 12c (e.g., corresponding to the P-well region 11f) provided between the first impurity diffusion portion 12a and the second impurity diffusion portion 12b. The semiconductor crystal resonance layer includes at least a part of the semiconductor crystal. In other words, the semiconductor crystal resonance layer corresponds to the element region 12.

The element unit 150 includes an electrode provided on the intermediate portion 12c. In this example, the gate electrode 16 is used as this electrode.

The first terminal 160 is electrically connected to at least one selected from the first impurity diffusion portion 12a, the second impurity diffusion portion 12b, the intermediate portion 12c, and the electrode (the gate electrode 16) recited above.

In this example, the first terminal 160 is connected to the P-well layer 11e and is electrically connected to the intermediate portion 12c (the P-well region 11f) corresponding to the channel portion. On the other hand, the p-type substrate 11a and the deep N-well layer 11c are grounded.

The acoustic semiconductor device 111 further includes a base body (in this example, the p-type substrate 11a) and the element-separating unit 13s provided on the base body. For example, the acoustic resonance unit 155 includes the base body, the element-separating unit 13s and the semiconductor crystal resonance layer. The semiconductor crystal is disposed on the base body.

The semiconductor crystal resonance layer (the element region 12) is provided on the base body. The side surface of the semiconductor crystal resonance layer (the element region 12) contacts the element-separating unit 13s. The element-separating unit 13s is provided around the element region 12. The acoustic impedance of the element-separating unit 13s is different from the acoustic impedance of the semiconductor crystal resonance layer.

In this example, the element-separating unit 13s includes an insulating layer (e.g., a $SiO_2$ layer, etc.). However, the embodiment is not limited thereto. The configuration of the element-separating unit 13s is arbitrary. For example, a hollow layer (a layer of air, etc.) may be used as the element-separating unit 13s.

By providing the element-separating unit 13s, the semiconductor crystal resonance layer (the element region 12) operates as a resonator by an acoustic standing wave being excited.

According to the acoustic semiconductor device 111 having such a configuration, an acoustic semiconductor device that realizes a novel inductor element having a large inductance can be provided. The configuration recited above according to the embodiment is constructed based on the following phenomena discovered by experiments performed independently by the inventors. Such experiments will now be described.

In these experiments, a novel resonant circuit having a structure similar to that of a CMOS transistor was constructed; and the characteristics thereof were measured.

Figure 2:
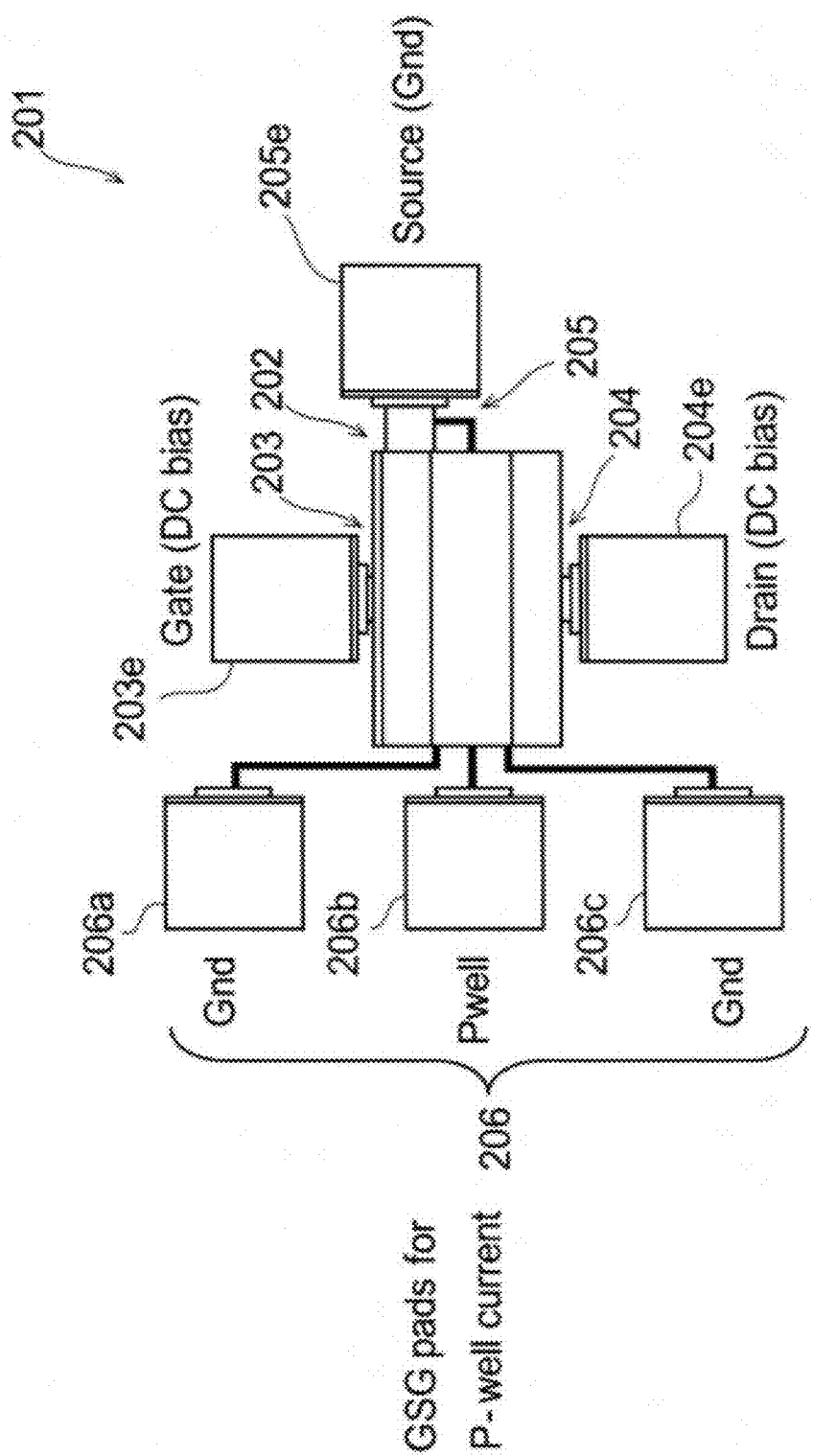
FIG. 2 is a schematic view illustrating the configuration of the semiconductor device used in the experiment.

FIG. 2 is a schematic view illustrating the configuration of the semiconductor device used in the experiments.

FIG. 2 illustrates a layout pattern of an element 201 used in this experiments.

Figure 3:
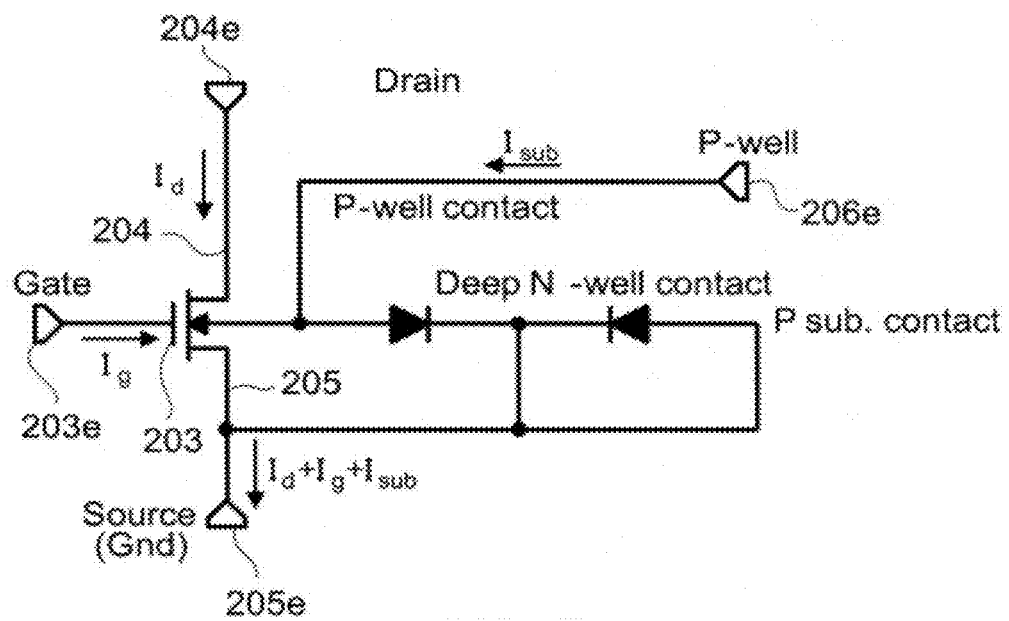
FIG. 3 is an equivalent circuit diagram illustrating the configuration of the semiconductor device used in the experiment.

FIG. 3 is an equivalent circuit schematic illustrating the configuration of the semiconductor device used in the experiment.

As illustrated in FIG. 2 and FIG. 3, the element 201 used in the experiments includes a gate 203, a drain 204, and a source 205 provided in the interior of a double well structure 202. This structure is similar to the structure of, for example, an NMOS transistor. GSG terminals 206 (a Gnd terminal 206a, a Gnd terminal 206c, and a P-well terminal 206b) drawn out from the p-type well were used as probe terminals for measuring the high frequency signal by using a coaxial cable and a coaxial probe. Terminals (a gate terminal 203e, a drain terminal 204e, and a source terminal 205e) configured to apply direct-current bias voltages to the gate 203, the drain 204, and the source 205 were disposed respectively. The element 201 was constructed using a standard CMOS process.

In the element 201, the resonance characteristics were measured at the GSG terminals 206 connected to the P-well in the state in which no contact probes were applied to the gate terminal 203e and the drain terminal 204e during the measurements.

Figure 4:
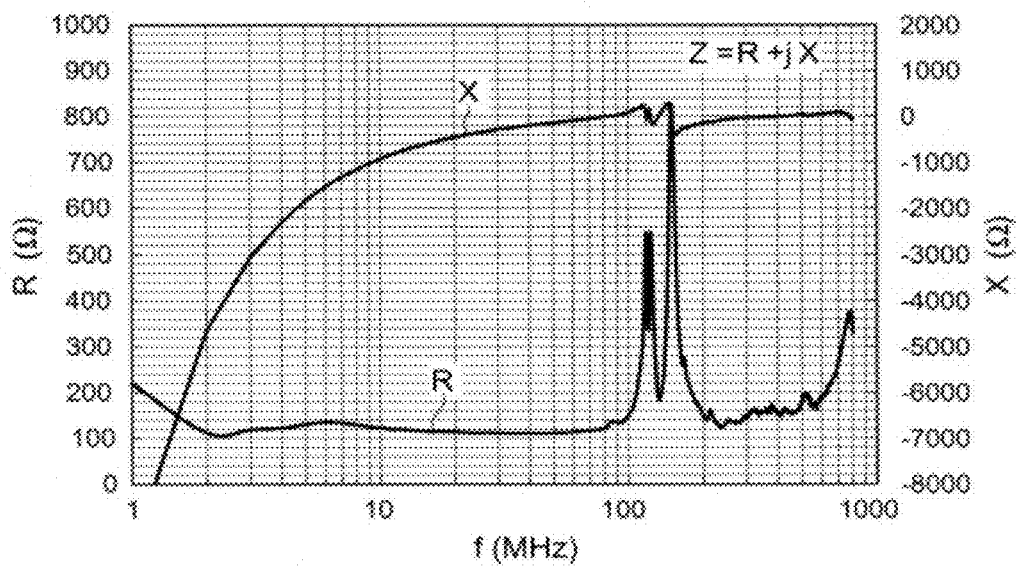
FIG. 4 is a graph illustrating the measurement results of the characteristics of the acoustic semiconductor device.

FIG. 4 is a graph illustrating the measurement results of the characteristics of the acoustic semiconductor device.

The horizontal axis of this graph denotes frequency f. The vertical axis on the left side is the real part R of the obtained impedance (Z=R+jX); and the vertical axis on the right side is the imaginary part X.

It was learned that a resonance phenomenon is observed in the element 201 recited above in the state in which the gate 203 and the drain 204 were kept open during the measurements as illustrated in FIG. 4. In other words, resonance peaks were observed for the real part R at the frequency f between 100 MHz and 200 MHz.

Figure 5:
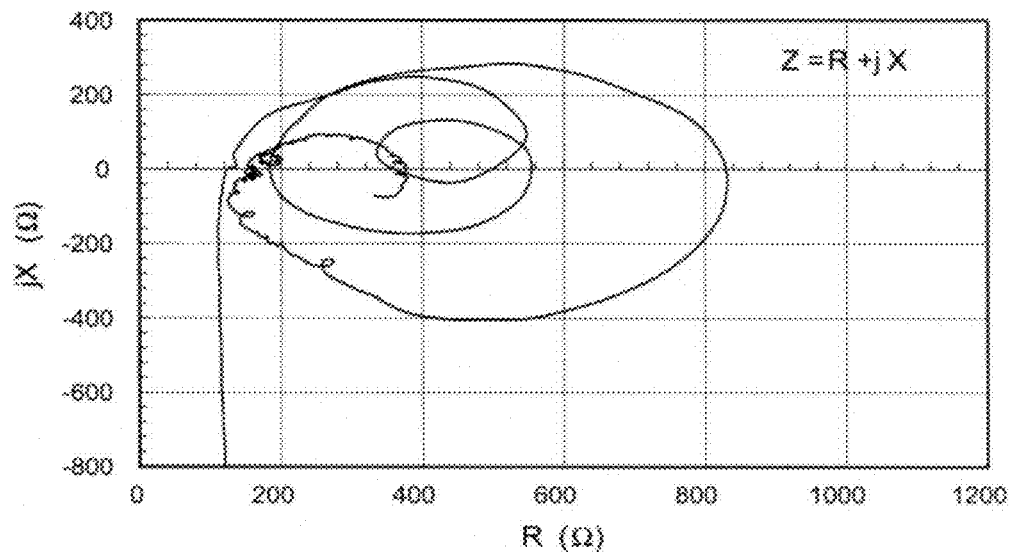
FIG. 5 is a graph illustrating the measurement results of the characteristics of the acoustic semiconductor device.

FIG. 5 is a graph illustrating the measurement results of the characteristics of the acoustic semiconductor device.

This graph illustrates the relationship between the real part R and the imaginary part X based on the measurement results illustrated in FIG. 4. The horizontal axis is the real part R; and the vertical axis is the imaginary part (jX).

It can be seen from FIG. 5 that the characteristic of the impedance forms a circle. This indicates that the element 201 has a resonance characteristic. Further, the imaginary component (the imaginary part X) is positive in a specific frequency range. Therefore, it was learned that this characteristic corresponds to the inductance component.

The current-voltage characteristic of the element 201 was measured using a semiconductor parameter analyzer. As a result, it was learned that the element 201 functions as an amplifier when viewed as a transistor. In other words, both a resonance characteristic and an amplification effect were observed for the single element 201 (the single transistor).

An oscillator is formed of an amplifier and a resonator. From the measurement results recited above, it was learned that the element 201 (the single MOSFET) functions as an oscillator.

The measurement results of the resonance characteristic recited above were analyzed. Namely, the element 201 was represented by an LCR equivalent circuit and compared to the measurement results recited above.

Figure 6:
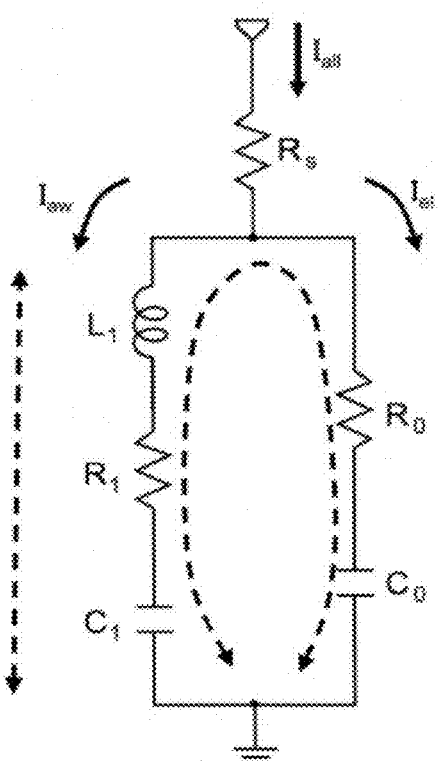
FIG. 6 is a circuit diagram illustrating the equivalent circuit used to analyze the characteristics of the semiconductor device used in the experiment.

FIG. 6 is a circuit diagram illustrating the equivalent circuit used to analyze the characteristics of the semiconductor device used in the experiment. In the equivalent circuit corresponding to the element 201 as illustrated in FIG. 6, a resistor $R_0$ and a capacitor $C_0$ are connected in series; and an electric current $I_{el}$ flows in the resistor $R_0$ and the capacitor $C_0$. An inductor $L_1$, a resistor $R_1$, and a capacitor $C_1$ are connected in series; and an acoustic current $I_{aw}$ flows in the inductor $L_1$, the resistor $R_1$, and the capacitor $C_1$. These are connected in parallel and then connected in series with a resistor $R_s$. A current $I_{all}$ of the entirety flows in the resistor $R_s$. Parameters that correspond to the measurement results were determined using such an equivalent circuit.

Figure 7A:
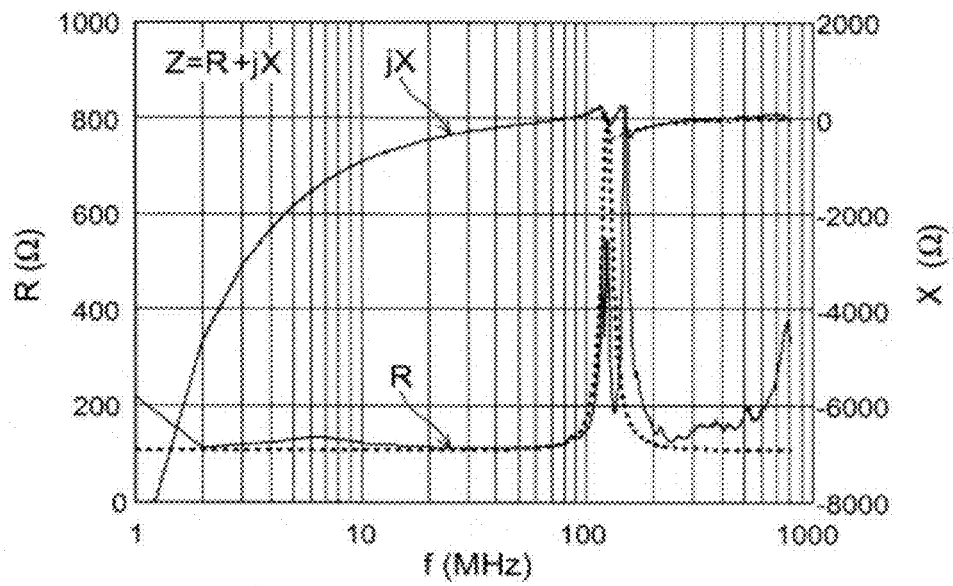
FIG. 7A and FIG. 7B are graphs illustrating characteristics of the equivalent circuit corresponding to the characteristics of the semiconductor device used in the experiment.
Figure 7B:
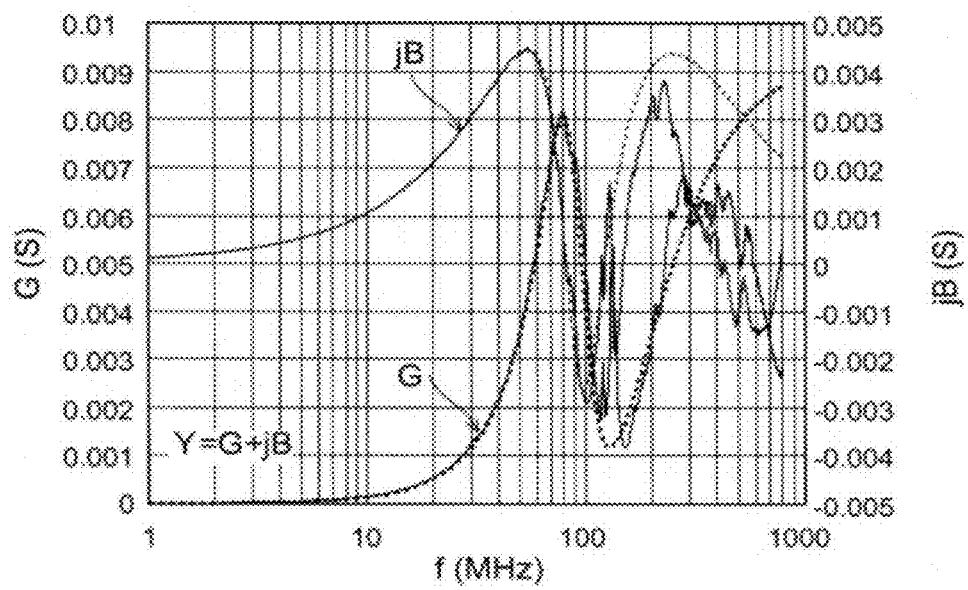

FIG. 7A and FIG. 7B are graphs illustrating characteristics of the equivalent circuit corresponding to the characteristics of the semiconductor device used in the experiment.

FIG. 7A illustrates the impedance characteristic (the characteristic of Z=R+jX). FIG. 7B illustrates the admittance characteristic (the characteristic of Y=G+jB). These graphs illustrate the results when the parameters of the components in the equivalent circuit recited above are extracted to match the resonance characteristic of the experimental values. In these graphs, the solid lines are the measured values; and the broken lines are the simulation values using the equivalent circuit recited above.

As the result of the parameters fitting, the values were extracted as $R_s$=96 ohms (Ω), $R_0$=13Ω, $C_0$=7.4 picofarads (pF), $L_1$=396 nanohenries (nH), $R_1$=32.6Ω, and $C_1$=9.6 pF.

In the region of low frequencies f not more than 150 MHz as illustrated in FIG. 7A and FIG. 7B, the simulation values of the impedance characteristic and the admittance characteristic match the measured values well. In other words, the element 201 has the characteristics of the equivalent circuit illustrated in FIG. 6.

The capacitor $C_0$ can be considered to be the pn junction capacitances between the P-well layer 11e and the deep N-well layer 11c, between the P-well layer 11e and the first impurity diffusion portion 12a, and between the P-well layer 11e and the second impurity diffusion portion 12b. The resistor $R_0$ can be considered to be the parasitic resistance of the Si. On the other hand, in the LCR series resonant circuit of the equivalent circuit, it is conceivable that the inductor $L_1$, the capacitor $C_1$, and the resistor $R_1$ correspond to acoustic resonance.

In the equivalent circuit, the value of the inductor L1 (396 nH) is extremely large. Therefore, it is difficult to conceive that this value corresponds to, for example, an inductor based on a circuit element (or a parasitic component of an interconnect) on the CMOS.

Generally, even in the case where a spiral inductor is constructed on the CMOS substrate, the inductance thereof has a maximum of about 5 nH to 10 nH. Because the observed resonant frequency is low at about 100 MHz, it is conceivable that this characteristic corresponds to the propagation velocity of an acoustic wave being smaller than the velocity of an electromagnetic wave by a factor of $10^4$ or more.

The equivalent circuit recited above is analogous to the equivalent circuit of a piezoelectric resonator. In a piezoelectric resonator, the acoustic resonance is represented by an LCR equivalent circuit. When represented by such an equivalent circuit, the actual measured values of the frequency characteristic of the impedance can be matched very well.

Accordingly, although it is conceivable to assume that some coupling occurs between electrical energy and mechanical energy in the P-well, it is hardly possible in principle that a piezoelectric effect occurs in a crystal of Si because of its crystal symmetry.

Accordingly, as a remaining possibility, an interaction is conceivable between charge density and an acoustic wave inside the semiconductor. In other words, it is conceivable that an acoustic wave is generated by an interaction occurring due to the deformation potential coupling that occurs, albeit weakly, between the charge density and the acoustic wave inside the semiconductor. It is conceivable that this is the source of the markedly large inductance value of 396 nH extracted in this experiment.

Thus, the inventors experimentally observed the phenomenon that a large inductance is substantially obtained in the semiconductor device having the configuration recited above. It is conceivable that this phenomenon is based on an acoustic wave occurring electrically according to the interaction between conduction carriers and the acoustic wave inside the semiconductor. In the embodiment, a specific configuration of an acoustic semiconductor device utilizing this phenomenon is constructed.

According to the embodiment, an acoustic semiconductor device that realizes a novel inductor element having a large inductance can be provided.

An example of an interpretation regarding the operational mechanism in which such characteristics are obtained will now be described.

In the acoustic semiconductor device according to the embodiment, a region where the acoustic wave propagates inside the semiconductor crystal is provided; and a configuration to move charge in the same direction along the propagation of the acoustic wave is further provided.

In such a configuration, the propagation of the acoustic wave is coupled to the propagation of the charge; and the charge moves with the propagation of the acoustic wave. In other words, an electric current is generated by the propagation of the acoustic wave. Thus, the generated current (the acoustic current) has a property of tending to continue to flow in the same direction as the acoustic wave as long as the acoustic wave propagates in a specific direction. In other words, such a configuration corresponds to inductance when represented by an electrical equivalent circuit.

Normally, the inductance component of an electronic circuit occurs due to electromagnetic coupling between a current and a magnetic field. Due to the electromagnetic coupling, self-inductance and mutual inductance occur. In other words, the self-inductance occurs because the magnetic field generated by the current flowing acts to cause the current to continue to flow in the same direction. The mutual inductance occurs because the magnetic field acts to change the current of other portions of the circuit.

On the other hand, the equivalent inductance occurring due to the acoustic wave occurs because the charge coupled to the acoustic wave inside the semiconductor tends to move in the same direction as long as the acoustic wave propagates in the specific direction. The propagation velocity of the acoustic wave is exceedingly slower than the propagation velocity of an electromagnetic wave. This is reflected by the equivalent inductance having an exceedingly large value when the inductance occurring as recited above is represented by the equivalent circuit.

Thereby, a large equivalent inductance is obtained in the embodiment.

Conventionally, it has been a formidable challenge generally to downsize an element having a large inductance. For example, although typically a spiral inductor has been used as the inductor on the semiconductor integrated circuit, it is difficult to form an inductor element having a large inductance inside the limited surface area inside the semiconductor integrated circuit. For example, in the case where the spiral inductor is formed using a standard CMOS process, the maximum value of the realizable inductance is about 10 nH.

Conversely, according to the embodiment as recited above, an extremely large inductance such as 396 nH can be realized with a small surface area.

Moreover, in the acoustic semiconductor device 111 according to the embodiment, the effect of the acoustic wave is limited to the range of the acoustic wave. Therefore, it is limited to cause undesired movement of charge in circuits of other portions formed on the same semiconductor substrate. In other words, noise does not occur easily.

Conventionally, in the case where the inductor is formed on the semiconductor substrate, an eddy current occurs inside the semiconductor substrate due to the effect of the magnetic field generated by the inductor; and the loss as an inductor increases. Also, the electromagnetic noise generated by the inductor acts as a source of noise for the other circuit components.

Conversely, in the embodiment, such a problem is avoided because the range of the acoustic wave is limited.

In the acoustic semiconductor device 111 according to the embodiment, a path of the charge is provided inside the region of the semiconductor crystal to efficiently couple the acoustic wave and the charge. In the path of the charge, movement of the charge is possible in the same direction as the direction in which the acoustic wave is supposed to propagate; and propagation does not occur easily in other directions.

It is desirable for such a path of the charge to be long and narrow and one-dimensional. However, the embodiment is not limited thereto. The path of the charge may be based on a two-dimensional plane.

Such an electrical path may be obtained by, for example, subdividing the side surface of the long and narrow path using a structural body of a conductivity type different from the conductivity type of the path. For example, in the case where the path is the p-type, an n-type structural body surrounds the side surface of the path. In the case where the path is the n-type, a p-type structural body surrounds the side surface of the path.

In the embodiment, a portion of the side surface or the entire side surface of the path of the charge may be subdivided by an insulator (e.g., $SiO_2$, etc.) or a cavity. Also, an electrode, etc., may be provided on the side surface of the path of the charge with a thin insulating film interposed.

An example of operations of the acoustic semiconductor device according to the embodiment will now be described. In such operations, the velocity of the acoustic wave propagating through the semiconductor changes due to the interaction between the acoustic wave and the charge.

The deformation-potential coupling effect is known as one form of the appearance of the interaction between the electric charge density and the acoustic wave propagating through the semiconductor crystal. In other words, the behavior of the conduction electrons is affected by the dynamic distortion of the crystal of the semiconductor.

A potential energy change $\delta E_{nk}$ of the electrons due to the deformation potential effect is roughly proportional to the expansion of the volume (the dilatation) $\delta V/V$ of the crystal (Formula 1).

[Formula 1]

$$\delta E_{nk} = a_{nk}(\delta V/V) \quad (1)$$

Here, $a_{nk}$ is a proportional coefficient regarding the volume deformation potential.

Figure 8A:
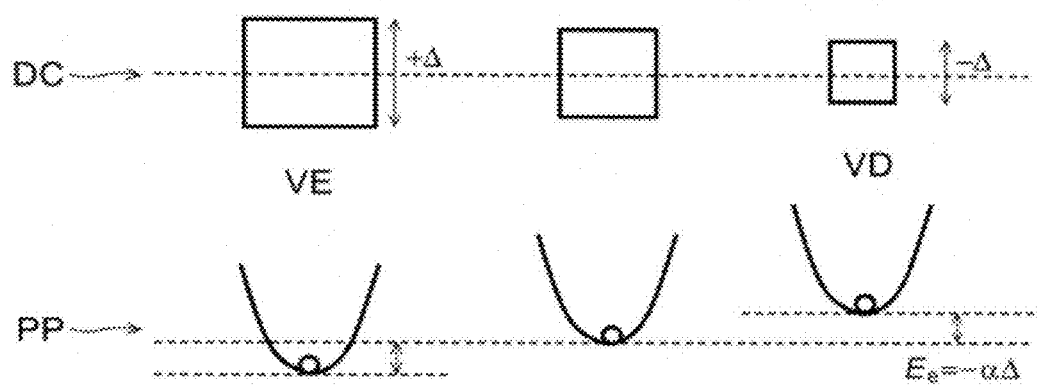
FIG. 8A and FIG. 8B are schematic views providing a model-like illustration of the characteristics of the acoustic semiconductor device.
Figure 8B:
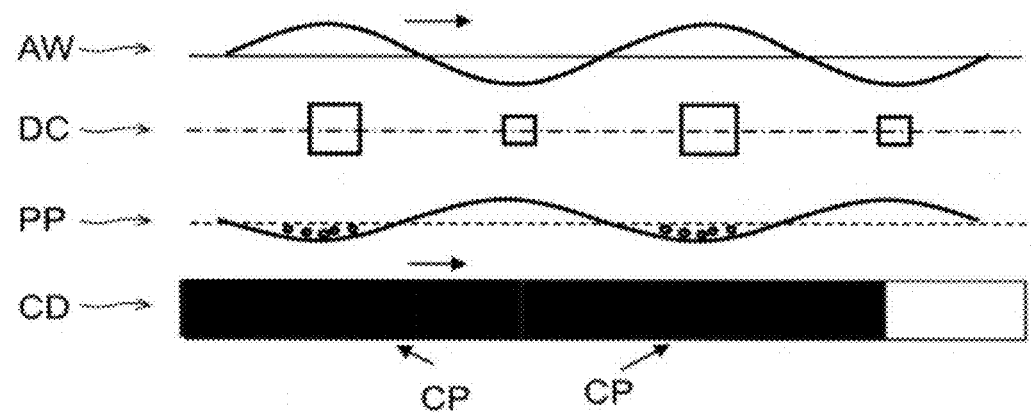

FIG. 8A and FIG. 8B are schematic views providing a model-like illustration of the characteristics of the acoustic semiconductor device. FIG. 8A conceptually illustrates the appearance of the crystal deformation and the electron potential change due to the deformation-potential coupling effect. FIG. 8B illustrates the interaction between the electric charge and the acoustic wave propagating through the semiconductor.

In a deformation of the crystal DC as illustrated in FIG. 8A, a volume expansion VE or a volume contraction VD occurs. In connection therewith, a potential energy PP (Particle Potential) of electrons changes.

An effect of the electric charge density on the crystal exists as a converse effect of the appearance of the interaction recited above between the acoustic wave and the electric charge. In other words, an effect of displacing the crystal occurs as a converse effect of the deformation potential if there is ununiformity in the distribution of the charge density. This effect causes the radiation of an acoustic wave due to the electrons under some specific conditions. In other words, the ununiformity of the charge density induces the force that drives the generation/amplification/attenuation of the acoustic wave.

When an acoustic wave AW (an elastic wave) propagates through the semiconductor crystal as illustrated in FIG. 8B, an expanding portion (the volume expansion VE) and a contracting portion (the volume contraction VD) are formed periodically inside the semiconductor crystal. A change in the potential energy PP of the electrons existing in the expanded portion and in the contracted portion occurs between the portions due to the deformation potential effect illustrated in Formula 1. The ununiformity of the electron density CD (e.g., a charge concentration CP) occurs at the same period as the wavelength of the acoustic wave AW because a distribution of the existence probability occurs due to the ununiformity of the potential energy PP.

When a direct-current electric field is applied in the same direction as the propagation direction of the sound in the state in which there is the ununiformity in the charge density, the electric charges are accelerated by the electric field and the drift velocity increases. When the drift velocity of the charge becomes faster than the propagation velocity of the acoustic wave due to a sufficiently high electric field, the propagation velocity of the acoustic wave increases as the amplitude of the acoustic wave is gradually amplified. Thus, the velocity of the acoustic wave can be changed by utilizing the interaction between the acoustic phonons and the electric charge. Accordingly, the oscillation frequency can be controlled by changing the resonant frequency of the acoustic standing wave excited inside the semiconductor crystal.

In an n-type semiconductor or a p-type semiconductor, the velocity of the acoustic wave propagating through the semiconductor crystal in the state in which carriers (i.e., electrons or holes) contributing to the conduction from the impurity state are excited depends on the carrier density. In the case where the carrier density is high, the velocity at which the acoustic wave propagates decreases. In the case where the carrier density is low, the velocity at which the acoustic wave propagates increases. Accordingly, the velocity of the acoustic wave can be changed by changing the carrier density inside the semiconductor crystal through which the acoustic wave propagates. Further, the oscillation frequency can be controlled by changing the resonant frequency of the acoustic standing wave excited inside the semiconductor crystal.

The acoustic semiconductor device 111 according to the embodiment outputs an electrical oscillation signal that is synchronous with the resonant frequency of the acoustic standing wave excited in a specific region on the semiconductor substrate.

As illustrated in FIG. 1A and FIG. 1B, a field effect transistor with a gate terminal, a source terminal, a drain terminal, and a back gate terminal can be used as such an acoustic semiconductor device.

The field effect transistor includes a source region and a drain region provided on the specific region, a channel region provided between the source region and the drain region, and a gate electrode provided on the channel region. The gate terminal, the source terminal, and the drain terminal are connected to the gate electrode, the source region, and the drain region, respectively. The back gate terminal may include a substrate terminal or a well terminal electrically connected to the channel region recited above.

In the embodiment, the region where the conductive carriers can move in the same direction as the acoustic wave propagating through the crystal of the semiconductor using the interaction between the acoustic wave and the charge may include the well region of the transistor recited above.

The gate electrode, the drain electrode, or the well terminal of the field effect transistor including the channel region formed in the element region can be used as the electric field application unit configured to apply the electric field to modulate the density of the conductive carriers.

According to the acoustic semiconductor device 111 according to the embodiment, an inductor element having a large inductance component that is easy to integrate on the semiconductor substrate can be realized. Thereby, for example, a resonator having a large inductance component that is easy to integrate on the semiconductor substrate can be realized. Then, an acoustic semiconductor device that functions as an oscillator having high frequency accuracy can be provided by using this inductive component.

Thus, according to the embodiment, a semiconductor device that functions as an inductor or a resonator having a large inductance component that is easy to integrate with other electronic circuits can be provided.

Generally, the velocity of an acoustic wave propagating through a solid has a value which is unique to the material under given conditions of temperature and pressure. On the other hand, in the embodiment, the velocity of the acoustic wave propagating through the semiconductor is electrically controlled by utilizing the interaction between the acoustic wave and the conduction carriers inside the semiconductor.

The semiconductor acoustic element according to the embodiment may be used as, for example, a choke coil, etc. Applications also are possible in a resonant circuit or a tuning circuit by combining with a capacitance element. Applications also are possible in a frequency filter or an oscillator circuit used to extract a designated frequency component or in various sensors used to detect by converting an acoustic signal into an electrical signal. Applications also are possible in a transformer used to convert voltage and current. Applications also are possible in various energy sources used to supply energy. Also, utilization is possible in a circuit used to modulate/demodulate a signal. Utilization is possible in an impedance matching circuit.

An example will now be described relating to the characteristics of the semiconductor acoustic element according to the embodiment in which the acoustic wave propagating through the semiconductor crystal has an effect on carriers such as electrons and holes.

When the acoustic wave (e.g., a longitudinal wave) propagates through the semiconductor crystal, a compression and an expansion of the semiconductor crystal are periodically repeated spatially and temporally. Due to the compression and the expansion of the semiconductor crystal, an effect (a deformation potential) occurs in which the potential felt by the charge (the electrons and the holes excited in the conduction band) increases or decreases.

Normally, the movement velocity of the charge (the carriers) is sufficiently higher than the propagation velocity of the sound inside the crystal. Therefore, the spatial ununiformity of the charge is generated in accordance with the charge concentration to where the potential is lowered by the acoustic wave.

When the travelling wave of the sound propagates through the crystal as illustrated in FIG. 8B, the location where the potential is lowered moves at the acoustic velocity in connection thereto. Therefore, the density ununiformity of the charge also moves to follow the same. Thus, the charge inside the crystal moves due to the propagation of the sound; and current flows. Herein, because this current is generated by the propagation of the acoustic wave, this current is called the acoustic current.

If an electrical alternating current signal is applied inside the semiconductor crystal, an electrical current flows periodically according to the electrical impedance. The superposition principle holds between the acoustic current and the current that accompanies the electrical signal, which are two type of alternating currents having different causes. Therefore, the currents amplify each other when the phases match and attenuate each other when out of phase.

In other words, for the frequency characteristics of the electrical impedance, the impedance appears to be small at the frequency where the phase of the acoustic wave and the phase of the electrical signal match each other; and the impedance appears to be large when out of phase. In other words, a series resonance and a parallel resonance are observed.

Thus, the reason that the impedance has a resonance characteristic can be described by assuming that an acoustic standing wave is excited inside the semiconductor crystal.

However, questions remain regarding whether or not the acoustic wave (the density ununiformity of the crystal) is generated by the electrical signal inside the Si crystal which has no piezoelectricity, and if so, regarding the reasons thereof.

Regarding this point, the following explanation is possible. In various physical phenomena, an energy conversion effect (e.g., the piezoelectric effect) always has a reverse effect (e.g., the converse piezoelectric effect). If a deformation potential occurs inside a Si crystal, there should also be a converse effect. This is a phenomenon in which the density ununiformity of the crystal, i.e., the acoustic wave, occurs as a result of the density ununiformity of the charge.

The relationship between the crystal deformation and the density ununiformity of the charge of an n-type semiconductor will now be described as an example.

Figure 9:
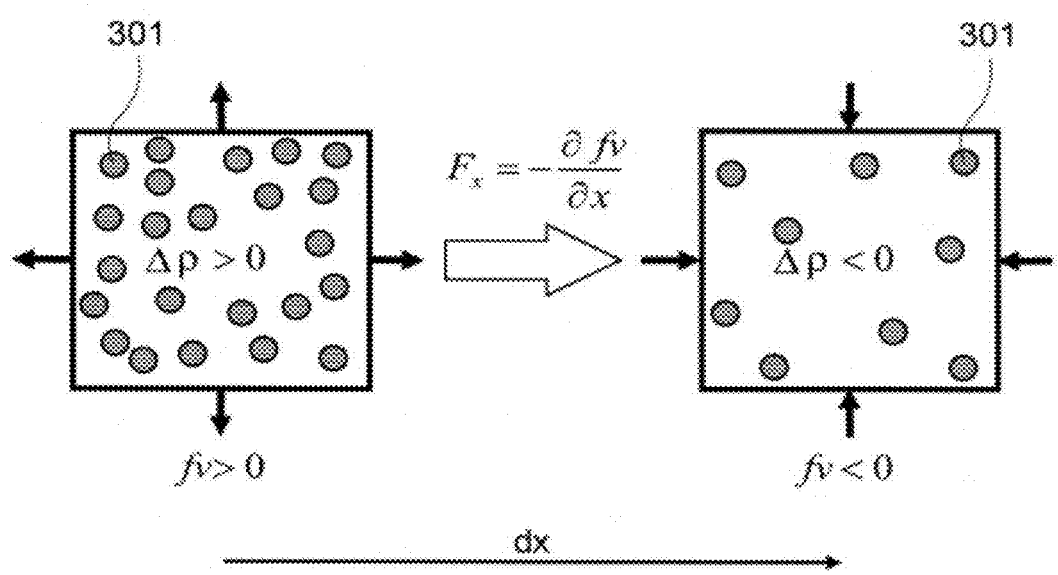
FIG. 9 is a schematic view illustrating a model of the relationship between the crystal deformation and the density ununiformity of the charge.

FIG. 9 is a schematic view illustrating a model of the relationship between the crystal deformation and the density ununiformity of the charge.

The drawing on the right of FIG. 9 illustrates the state of a region where the electron density is sparse; and the drawing on the left of FIG. 9 illustrates the state of a region where the electron density is dense. For example, in the n-type semiconductor, the state is supposed in which electrons are excited from all of the impurity atoms and a density ununiformity of the electron density has occurred spatially for some reason.

As illustrated in the drawing on the left of FIG. 9, a force fv (fv>0) of the volume expansion occurs due to the converse effect of the deformation potential in the region where charges 301 are dense. On the other hand, as illustrated in the drawing on the right of FIG. 9, the force fv (fv<0) of the volume contraction occurs due to the converse effect of the deformation potential in the region where the charges 301 conversely are sparse.

As a result, in the case where ununiformity of the charge density occurs for some reason in the interior of the same semiconductor crystal, a force Fx occurs to cause parallel movement in the crystal proportionally to the slope of the charge density.

It is conceivable that such a converse effect of the deformation potential normally is not problematic because the movement velocity of the electrons is higher than the velocity at which the acoustic wave (the density ununiformity of the crystal) propagates as described above. Because the movement of the charge is fast, the charge density is averaged prior to the deformation (the compression/expansion) of the crystal manifesting due to the converse effect of the deformation potential; and the forces that may generate the acoustic wave are neutralized. The atoms of the crystal cannot deform quickly because the atoms are constrained inside the crystal and cannot move easily or because the mass of the atom is greater than the mass of the electron.

However, if circumstances are realized in which the movement velocity of the carriers inside the semiconductor crystal becomes slower than the propagation velocity of the sound for some reason, there is a possibility that the semiconductor crystal may deform, that is, the acoustic wave may be generated, due to the density ununiformity of the charge.

Figure 10:
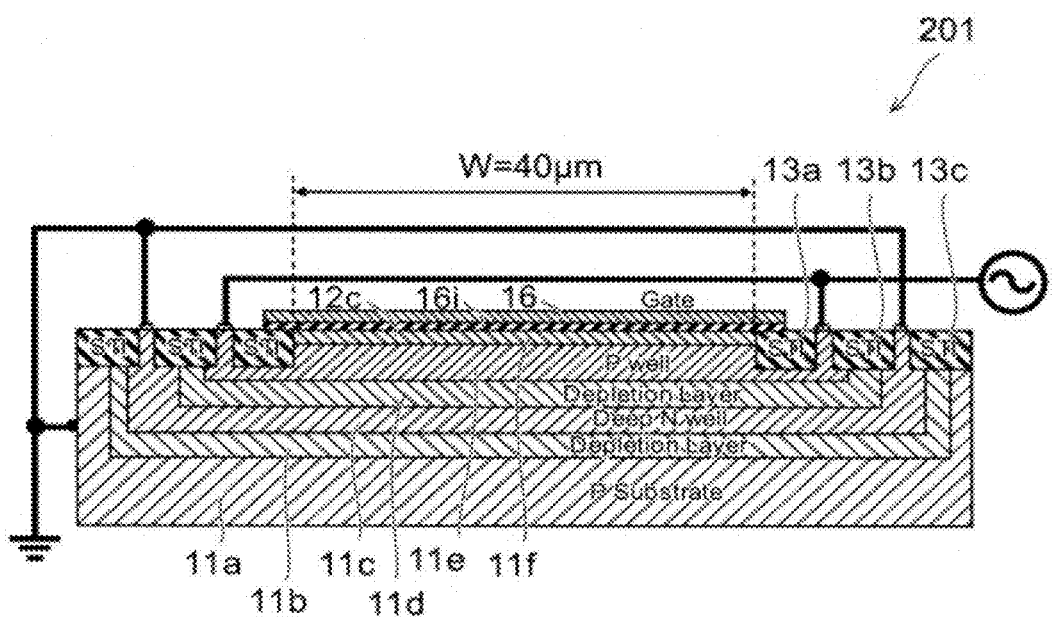
FIG. 10 is a schematic cross-sectional view illustrating the acoustic semiconductor device according to the first embodiment.

FIG. 10 is a schematic cross-sectional view illustrating the configuration of the acoustic semiconductor device according to the first embodiment.

FIG. 10 also corresponds to the configuration of the element 201 used in the experiment recited above.

As illustrated in FIG. 10, the element 201 in which the resonance phenomenon was observed in the experiment recited above includes a double well structure. The P-well layer 11e is provided in the element region; and the deep N-well layer 11c is disposed below the P-well layer 11e. The long and narrow P-well region 11f interposed between the source region and the drain region is formed at the lower portion of the gate electrode 16.

The electrical resistance of the charge passing through the long and narrow P-well region 11f increases easily. Moreover, these layers (the P-well layer 11e and the deep N-well layer 11c) are interposed between the depletion layer 11b and the depletion layer 11d upward, downward, leftward, and rightward.

Figure 11A:
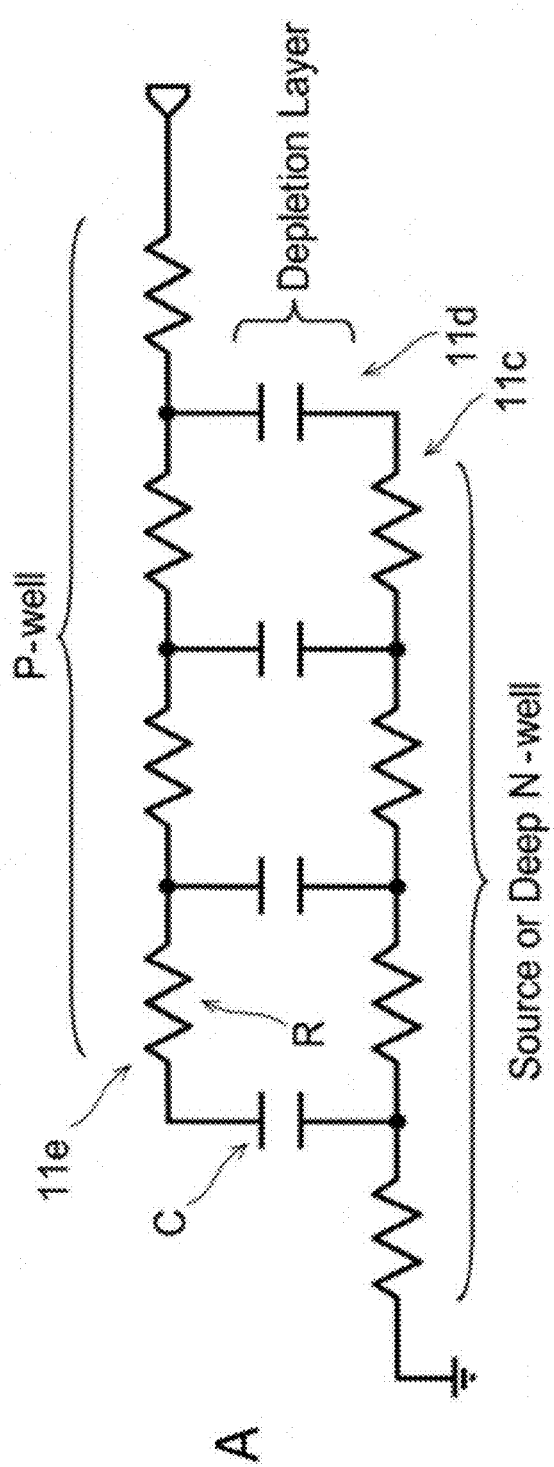
FIG. 11A and FIG. 11B are circuit diagrams illustrating the acoustic semiconductor device according to the first embodiment.
Figure 11B:
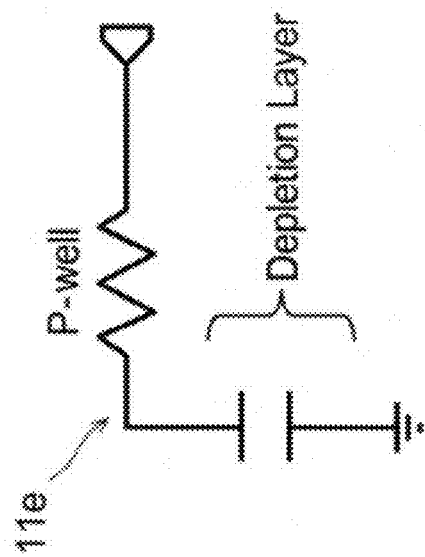

FIG. 11A and FIG. 11B are circuit diagrams illustrating the configuration of the acoustic semiconductor device according to the first embodiment.

FIG. 11A illustrates a CR equivalent circuit model of the impedance as viewed from the P-well layer 11e. FIG. 11B illustrates a simplified equivalent circuit.

As illustrated in FIG. 11A, the P-well layer 11e, the deep N-well layer 11c, and the depletion layer 11d can be considered to be a CR circuit over a long distance. When the charge moves in such a configuration, the long distance is travelled while charging the capacitive components of these depletion layers. In other words, it can be said that the propagation velocity of the charge density moving through the semiconductor crystal is about the CR time constant.

The CR time constant of the P-well layer 11e was specifically estimated from the actual measurement results of the frequency characteristic of the impedance. Here, although it is conceivable that the resistors and the capacitors actually are distributed as in the equivalent circuit illustrated in FIG. 11A, in this estimation, the equivalent circuit of the lumped constants illustrated in FIG. 11B was assumed for simplification.

Fitting was performed for the CR equivalent circuit recited above to match the calculated values and the values of the measurement results of the impedance in the low frequency region of 100 MHz and less. As a result, the values of C=17 pF and R=126Ω were obtained. From these values, the CR cut-off frequency $f_{CR}$ was about 74 MHz when estimated using Formula 2 recited below.

[Formula 2]

$$f_{CR} = \frac{1}{2\pi CR} = 74 \text{ MHz} \qquad (2)$$

The cut-off frequency $f_{CR}$ is substantially the same as or slightly less than the series resonance frequency (about 80 MHz) and the parallel resonance frequency (about 120 MHz) considered to occur due to the acoustic resonance.

This indicates that the movement velocity of the charge propagating through the P-well layer 11e is slower than the propagation velocity of the acoustic wave. Thereby, the circumstances are realized in which the crystal deformation is generated. In other words, an environment is realized in which uniformity of electrical charge density is not achieved rapidly when the ununiformity once occurs.

In conclusion, a periodic crystal deformation is caused in a semiconductor layer having a long and narrow one-dimensional structure sandwiched between opposite conductive polarities on, for example, the upward, downward, leftward, and rightward sides by providing an electrical alternating current signal from the outside. In other words, in such a semiconductor layer, the electrical signal couples easily with the acoustic wave.

If there is coupling between the acoustic wave and the charge density, the coupling coefficient can be estimated from the resonant waveform using an analogy with piezoelectric resonance, which is a similar phenomenon. In the case of piezoelectric electromechanical coupling, a coupling coefficient $k^2$ is defined as the proportion of mechanically-stored energy to the electrically-input energy. Experimentally, the coupling coefficient $k^2$ can be determined using the proportion of the frequency of the series resonance to the frequency of the parallel resonance.

As described above in regard to FIG. 7A and FIG. 7B, the values of $R_s=96\Omega$, $R_0=13\Omega$, $C_0=7.4$ pF, $L_1=396$ nH, $R_1=32.6\Omega$, and $C_1=9.6$ pF were extracted as the simulation parameters for the equivalent circuit to fit with the experimental values. From these values, the series resonance frequency $f_{sr}$ and the parallel resonance frequency $f_{pr}$ were determined using Formula 3 and Formula 4 recited below.

[Formula 3]

$$f_{sr} = \frac{1}{2\pi}\sqrt{\frac{1}{L_1 C_1}} = 81.6 \text{ MHz} \quad (3)$$

[Formula 4]

$$f_{pr} = \frac{1}{2\pi}\sqrt{\frac{1}{L_1}\left(\frac{1}{C_0}+\frac{1}{C_1}\right)} = 123.7 \text{ MHz} \quad (4)$$

Figure 12:
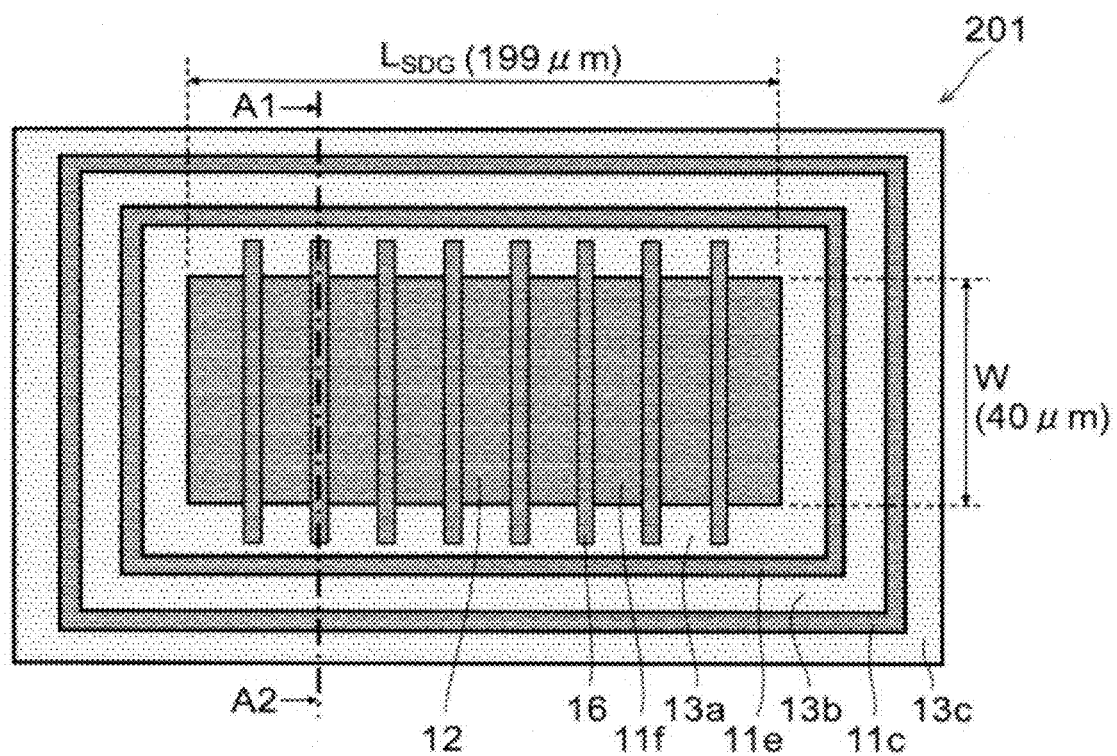
FIG. 12 is a schematic plan view illustrating the semiconductor device used in the experiment.

FIG. 12 is a schematic plan view illustrating the configuration of the semiconductor device used in the experiment.

As illustrated in FIG. 12, the size (W×$L_{SDG}$) of the element region of the element 201 is 40 μm×199 μm. FIG. 10 corresponds to the cross-sectional view along line A1-A2 of FIG. 12.

Figure 13:
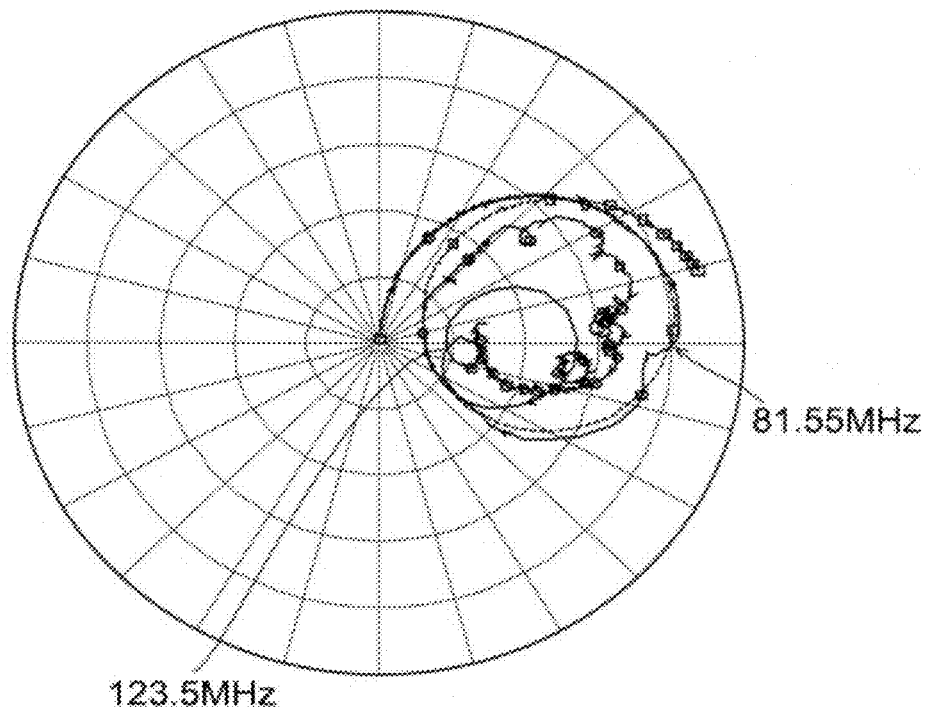
FIG. 13 is a graph illustrating the measurement results of the characteristics of the acoustic semiconductor device.

FIG. 13 is a graph illustrating the measurement results of the characteristics of the acoustic semiconductor device.

This graph illustrates the admittance as viewed from the P-well terminal in polar coordinates. In this graph, the solid line illustrates the actual measured values; and the broken line illustrates the simulation results using the equivalent circuit and the extracted parameters. Of this admittance circle, the upper half of the graph corresponds to the capacitive admittance; and the lower half corresponds to the inductive admittance.

As illustrated in FIG. 13, the imaginary part of the admittance becomes zero once at about 81 MHz. Although it becomes zero again at about 123 MHz, this indicates that the p-well layer 11e equivalently operates as an inductor in the frequency range therebetween. In the equivalent circuit, the former corresponds to the series resonance frequency $f_{sr}$; and the latter corresponds to the parallel resonance frequency $f_{pr}$.

Thus, the series resonance frequency $f_{sr}$ and the parallel resonance frequency $f_{pr}$ determined using Formula 3 and Formula 4 recited above substantially match the frequencies directly estimated from the admittance circle illustrated in FIG. 13.

The coupling coefficient $k^2$ was estimated from these frequencies using Formula 5 recited below.

[Formula 5]

$$k^2 = \frac{\pi}{2}\frac{f_s}{f_p}\tan\left(\frac{\pi}{2}\frac{f_p - f_s}{f_p}\right) \quad (5)$$

This value is large enough to be comparable to those of PZT ceramics widely used as piezoelectric materials.

The acoustic velocity $V_L$ was estimated using Formula 6 recited below, where the series resonance frequency $f_{sr}$ was 81 MHz and the width W of the size of the element was 40 μm.

[Formula 6]

$$\begin{aligned}V_L &= 2Wf_{sr} \\ &= 2\times 40 \text{ (μm)} \times 81.6 \text{ (MHz)} \\ &= 6.53\times 10^5 \text{ (cm/s)}\end{aligned} \quad (6)$$

In Formula 6, W is multiplied by 2 because the wave of the sound makes a round trip of the size (the distance) of the element in the time corresponding to one period. Thus, in this experiment, the acoustic velocity $V_L$ was about 6.53×10⁵ cm/s.

Table 1 lists the acoustic velocities propagating through a Si single crystal.

TABLE 1

| PD | MODE | | (10⁵ cm/s) |
|---|---|---|---|
| [100] | $V_L$ | $(C_{11}/\rho)^{1/2}$ | 8.43 |
| | $V_T$ | $(C_{44}/\rho)^{1/2}$ | 5.84 |
| [110] | $V_l$ | $[(C_{11}+C_{12}+2C_{44})/2\rho]^{1/2}$ | 9.13 |
| | $V_t\|$ | $V_t\| = V_T = (C_{44}/\rho)^{1/2}$ | 5.84 |
| | $V_t\bot$ | $[(C_{11}-C_{12})/2\rho]^{1/2}$ | 4.67 |
| [111] | $V_l'$ | $[(C_{11}+2C_{12}+4C_{44})/3\rho]^{1/2}$ | 9.36 |
| | $V_t'$ | $[(C_{11}-C_{12}+C_{44})/3\rho]^{1/2}$ | 5.10 |

Table 1 illustrates formulas of the acoustic velocities and the values thereof for modes of propagation directions PD.

It can be seen from Table 1 that the acoustic velocity $V_L$ determined by the experiment of 6.53×10⁵ cm/s substantially agrees the velocity of the longitudinal wave propagating in the [100] direction.

It is noteworthy that the lowest resonant frequency (81 MHz) resonates not in the direction of the long side (199 μm) of the rectangular element size but in the direction of the short side (40 μm).

It is conceivable that this is because the thickness of the P-well layer 11e is substantially constant at the cross section of the short-side direction while the thickness of the P-well layer is nonuniform to cross the multiple source/drain regions at the cross section of the long-side direction.

Similar measurements were performed for another element 201a (not illustrated) having a different size of the element region. The size (W×$L_{SDG}$) of the element region of the element 201a was 36.1 μm×144.4 μm. In the element 201a, a resonant frequency of about 94 MHz was obtained. The acoustic velocity $V_L$ of $6.78\times10^5$ cm/s was obtained by similarly estimating using Formula 7 recited below.

[Formula 7]

$$V_L = 2Wf_{sr} \\ = 2\times 36.1\ (\mu m)\times 94.0\ (MHz) \\ = 6.78\times 10^5 (cm/s) \quad (7)$$

Table 2 summarizes the characteristics of the two elements recited above.

TABLE 2

| W (μm) | $L_{SDG}$ (μm) | fsr (MHz) | $V_L$ ($10^5$ cm/s) |
|---|---|---|---|
| 40.0 | 199.2 | 81.6 | 6.53 |
| 36.1 | 144.4 | 94.0 | 6.78 |

As illustrated in Table 2, the acoustic velocity $V_L$ substantially match between the two elements recited above, i.e., the element 201 and the element 201a, for which the sizes of the element regions were different. In other words, the width W of the element size and the series resonance frequency $f_{sr}$ have an inversely proportional relationship; and the proportionality coefficient thereof corresponds to the acoustic velocity $V_L$.

In the element 201 (the width of the element size of 40 μm), the frequency characteristic of the impedance (the admittance) was measured while applying a direct-current bias voltage $V_{bias}$ to the P-well terminal; and analysis was performed.

Figure 14:
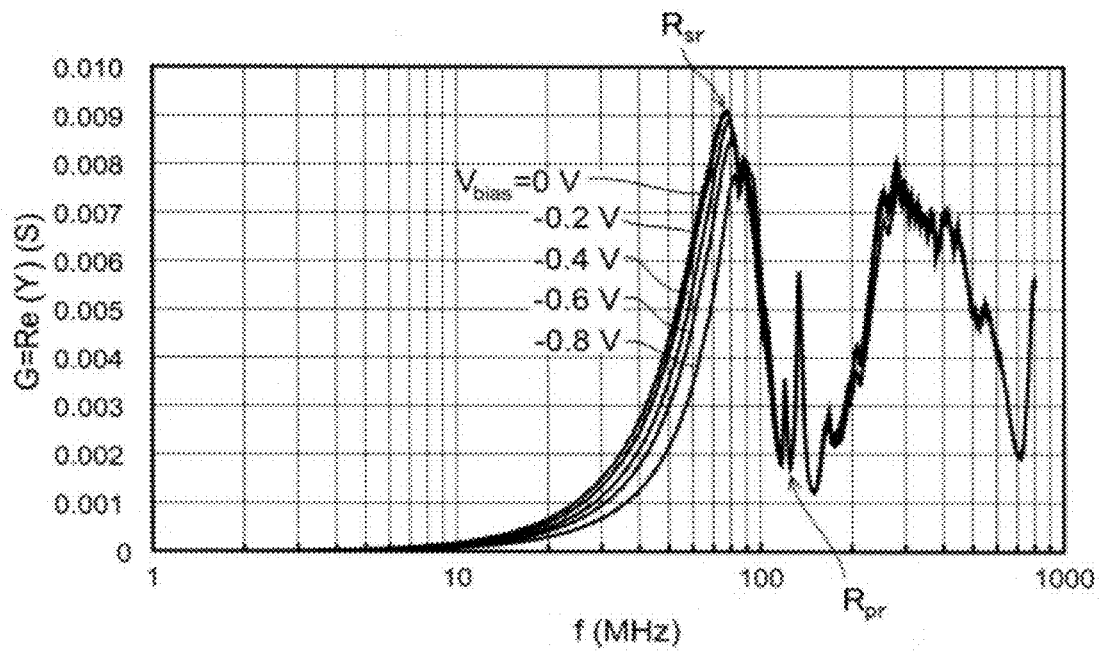
FIG. 14 is a graph illustrating the measurement results of the characteristics of the acoustic semiconductor device.
Figure 15:
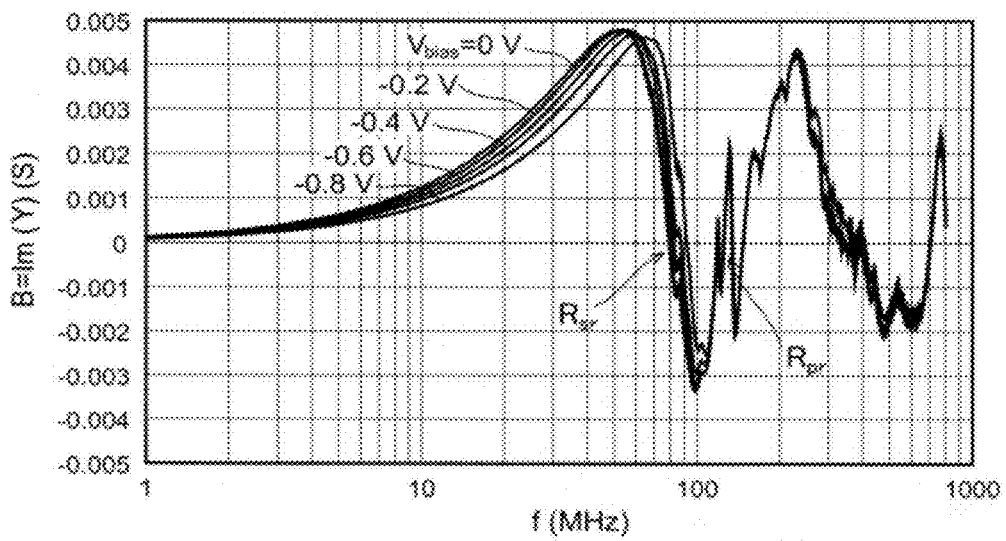
FIG. 15 is a graph illustrating the measurement results of the characteristics of the acoustic semiconductor device.

FIG. 14 and FIG. 15 are graphs illustrating the measurement results of the characteristics of the acoustic semiconductor device.

FIG. 14 illustrates the real part G of the admittance Y, i.e., G=Re(Y); and FIG. 15 illustrates the imaginary part B of the admittance Y, i.e., B=im(Y). The horizontal axes of these graphs illustrate the frequency f.

These graphs illustrate the actual measured values of the real part G and the imaginary part B when the bias voltage $V_{bias}$ applied to the P-well terminal was changed in the range of 0 volts (V) to −0.8 V.

As illustrated in FIG. 14 and FIG. 15, a series resonance $R_{sr}$ occurs when the frequency f is about 80 MHz; and a parallel resonance $R_{pr}$ occurs when the frequency f is about 110 MHz. The characteristics change as the bias voltage $V_{bias}$ is changed.

Namely, the series resonance frequency $f_{sr}$ observed near 80 MHz is dependent on the bias voltage $V_{bias}$. Further, it was learned that both the capacitor and the inductor of the series resonant circuit considered to correspond to the acoustic vibration were dependent on the bias voltage $V_{bias}$ when the parameters of the equivalent circuit were extracted.

Here, it was assumed that the series resonance frequency $f_{sr}$ is determined by the time necessary for the acoustic wave to complete a round trip of the width W of the element size of 40 μm. Then, the acoustic velocity $V_L$ was estimated for each of the bias voltages $V_{bias}$.

Figure 16:
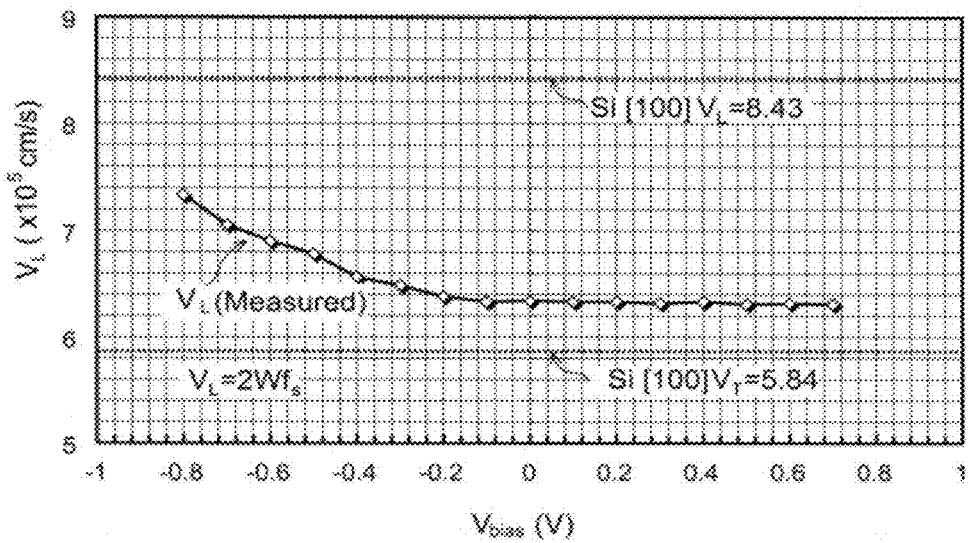
FIG. 16 is a graph illustrating the measurement results of the characteristics of the acoustic semiconductor device.

FIG. 16 is a graph illustrating the evaluation results of the characteristics of the acoustic semiconductor device.

This graph illustrates the actual measured values regarding the relationship between the acoustic velocity $V_L$ and the bias voltage $V_{bias}$. In this graph, the value of the acoustic velocity of the longitudinal wave propagating in the Si [100] direction ($8.43\times10^5$ cm/s) and the value of the acoustic velocity of the transverse wave ($5.84\times10^5$ cm/s) are illustrated by the broken line for comparison.

The acoustic velocity $V_L$ increases in the region where the bias voltage $V_{bias}$ is negative; and a trend is seen in which the acoustic velocity $V_L$ approaches the value of the acoustic velocity of the longitudinal wave propagating in the Si [100] direction ($8.43\times10^5$ cm/s).

Figure 17:
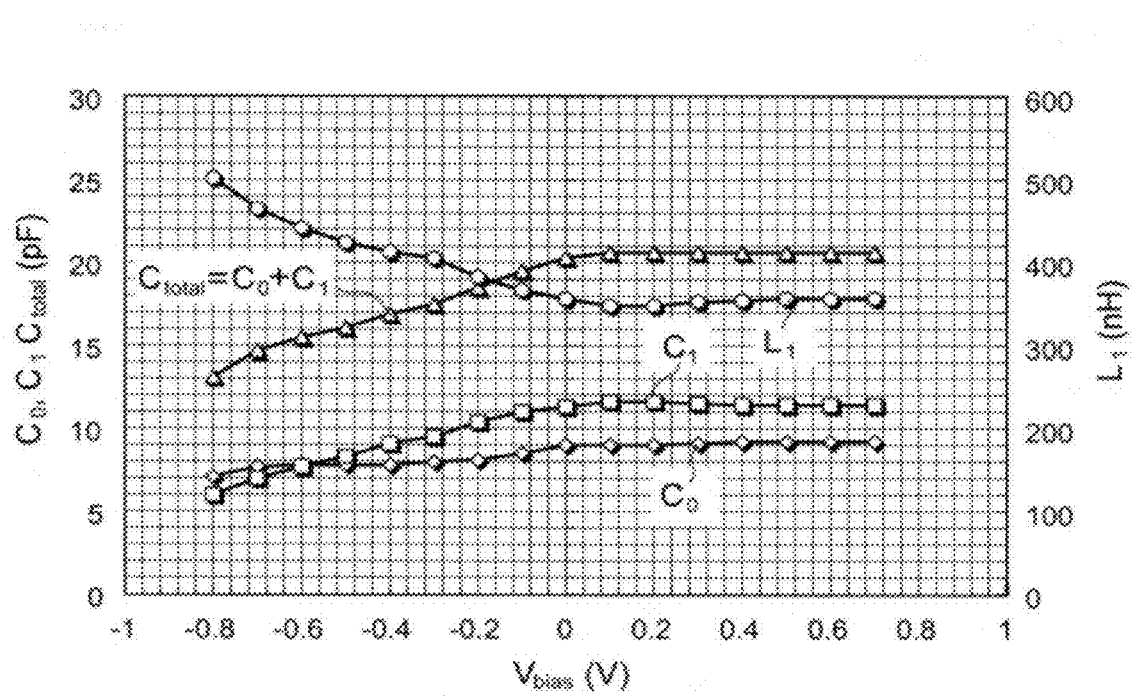
FIG. 17 is a graph illustrating the measurement results of the characteristics of the acoustic semiconductor device.

On the other hand, in the frequency region of not more than 200 MHz, the resonance characteristic was simulated using the equivalent circuit. FIG. 17 is a graph illustrating the evaluation results of the characteristics of the acoustic semiconductor device.

This drawing illustrates the parameter values (the capacitors $C_0$, $C_1$, $C_{total}$, and the inductor $L_1$) extracted for the equivalent circuit in the frequency region of not more than 200 MHz when the resonance characteristic was simulated using the equivalent circuit. The horizontal axis denotes the bias voltage $V_{bias}$.

As illustrated in FIG. 17, a trend is seen in which the capacitors $C_0$ and $C_1$, which are the capacitance components of the equivalent circuit, decrease on the negative bias side. A trend is seen in which the inductor $L_1$ increases on the negative bias side. It is conceivable that the decreases of the capacitances corresponds to the change in the thickness of the depletion layer of the pn junction, and have close correlation to the acoustic velocity.

Second Embodiment

Figure 18A:
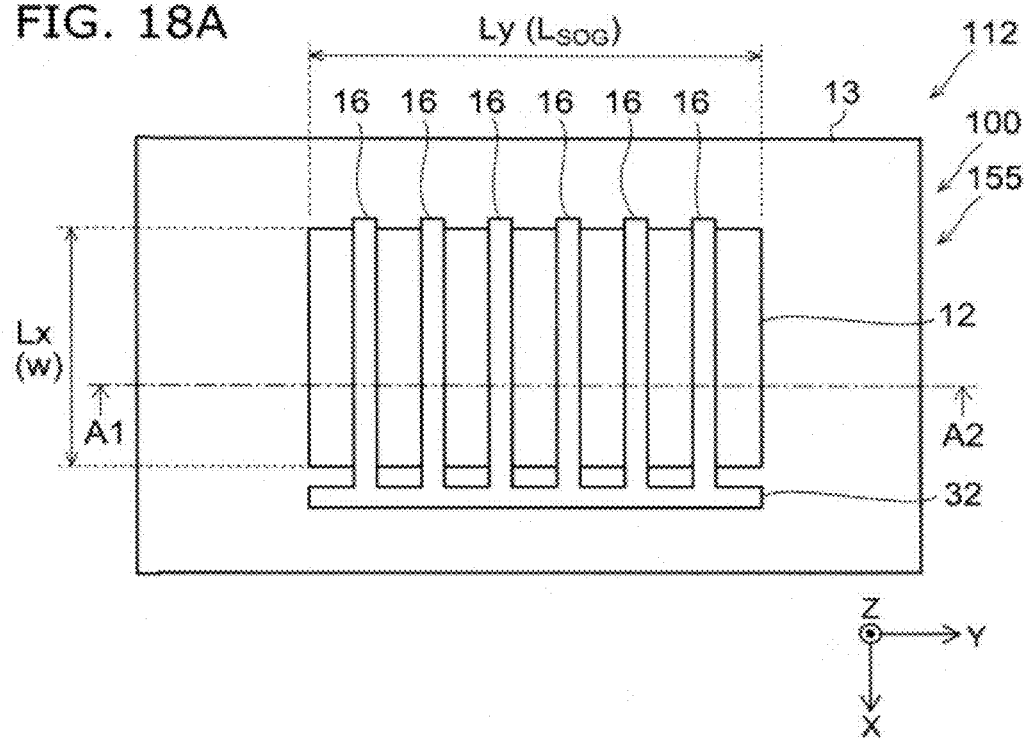
FIG. 18A and FIG. 18B are schematic views illustrating an acoustic semiconductor device of the second embodiment.
Figure 18B:
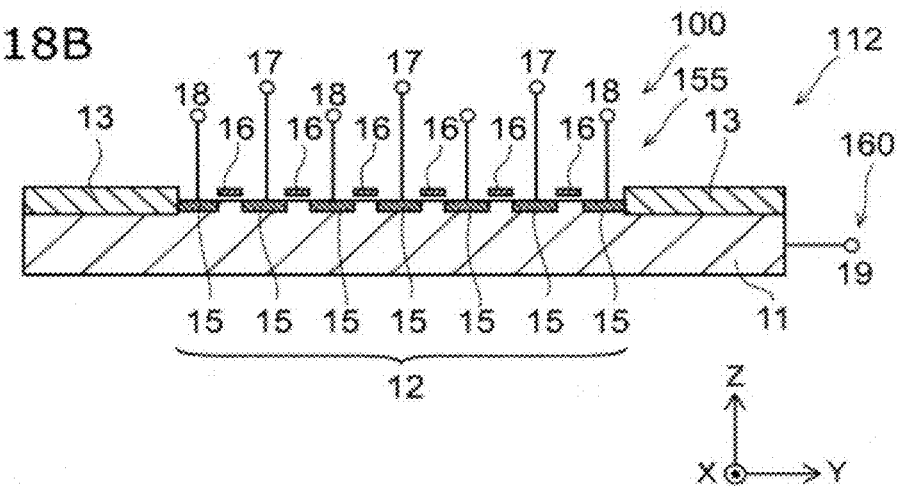

FIG. 18A and FIG. 18B are schematic views illustrating the configuration of an acoustic semiconductor device of a second embodiment.

FIG. 18A is the plan view. FIG. 18B is the cross-sectional view along line A1-A2 of FIG. 18A.

As illustrated in FIG. 18A and FIG. 18B, a semiconductor layer 11, for example, is provided in the acoustic semiconductor device 112 according to this embodiment. The semiconductor layer 11 may include, for example, a semiconductor substrate of silicon. The embodiment is not limited thereto. The semiconductor layer 11 may include, for example, a layer of a semiconductor provided on an insulating layer.

The element region 12 is provided in the semiconductor layer 11 (the semiconductor substrate). An element-separating region 13 is provided around the element region 12. The element-separating region 13 is, for example, an insulating film. The element-separating region 13 is formed of, for example, a silicon oxide film. The element-separating region 13 is used as an acoustic reflection layer.

The acoustic reflection layer of the element-separating region 13 is provided around the element region 12. The element region 12 is, for example, a rectangle having a first side (e.g., the side along the X-axis) of a first length Lx and a second side (e.g., the side along the Y-axis) of a second length Ly.

A field effect transistor 100 is formed on the element region 12. The field effect transistor 100 includes the gate electrode 16 and a source/drain region 15.

The source/drain region 15 is formed in the element region 12 on both sides of the gate electrode 16. The source/drain region 15 may include, for example, an impurity diffusion layer of a conductivity type opposite to that of the semiconductor layer 11 (the semiconductor substrate). In the element region 12, a channel region is formed between the multiple source/drain regions 15.

The gate electrode 16 is provided on the channel region of the element region 12. A not-illustrated gate insulating film is provided between the channel region and the gate electrode 16.

In this example, the gate electrode 16 extends along the X-axis. In this example, a plurality of the gate electrodes 16 is provided. The multiple gate electrodes 16 are arranged in the Y-axis direction. Although six gate electrodes 16 are provided in this example, the number of the gate electrodes 16 in the embodiments is arbitrary.

A gate terminal 32 is provided to apply a voltage to the gate electrodes 16.

A source terminal 18 and a drain terminal 17 are provided to apply voltages to the multiple source/drain regions 15 respectively. The source terminal 18 and the drain terminal 17 are disposed alternately.

An output terminal 19 is provided in the semiconductor layer 11 (the semiconductor substrate). The output terminal 19 is electrically connected to the channel region via the semiconductor layer 11 (the semiconductor substrate). In this example, the output terminal 19 corresponds to the first terminal 160.

Figure 19:
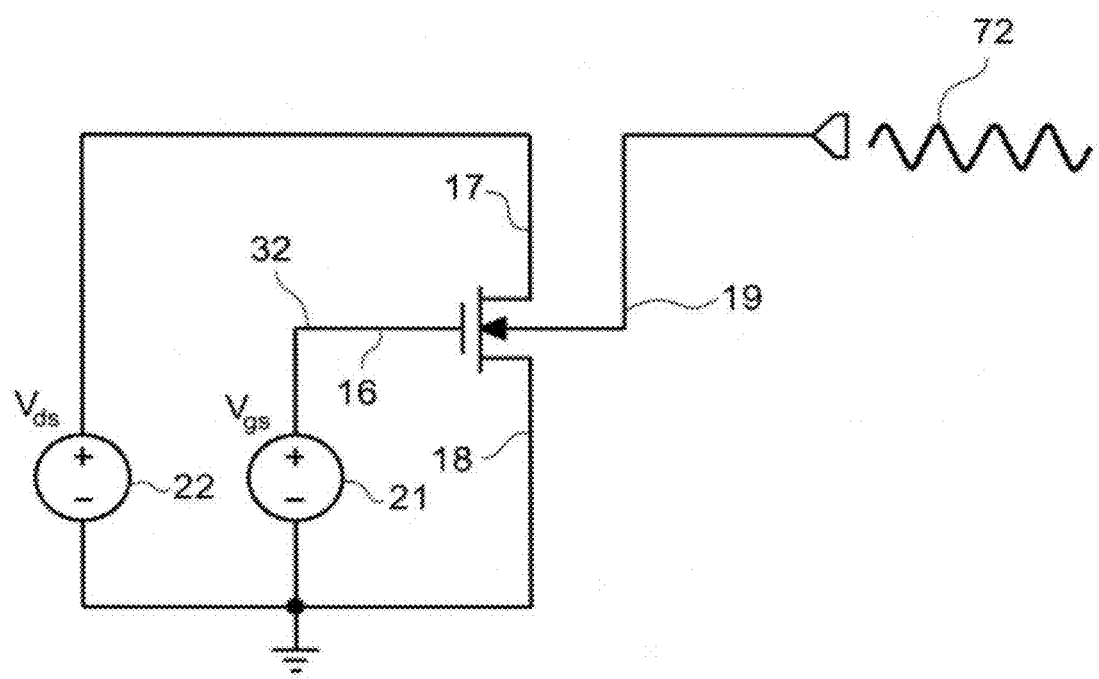
FIG. 19 is an equivalent circuit diagram illustrating the acoustic semiconductor device according to the second embodiment.

FIG. 19 is an equivalent circuit schematic illustrating the configuration of the acoustic semiconductor device according to the second embodiment. As illustrated in FIG. 19, a gate voltage $V_{gs}$ is applied between the source terminal 18 and the gate terminal 32; and a drain voltage $V_{ds}$ is applied between the source terminal 18 and the drain terminal 17. In other words, the direct-current voltage source 21 configured to apply the gate voltage $V_{gs}$ is connected between the source terminal 18 and the gate terminal 32. A direct-current voltage source 22 configured to apply the drain voltage $V_{ds}$ is connected between the source terminal 18 and the drain terminal 17.

The threshold voltage of the field effect transistor 100 is taken as $V_{th}$. The gate voltage $V_{gs}$ and the drain voltage $V_{ds}$ are set to satisfy Formula 8 recited below.

[Formula 8]

$$V_{th} < V_{gs} < V_{ds} + V_{th} \quad (8)$$

The oscillating substrate current is output from the output terminal 19 as a signal.

In the specification of the application, the substrate current in the field effect transistor refers to the current generated inside the substrate or the well with impact ionization in the channel region as the main cause.

Figure 20A:
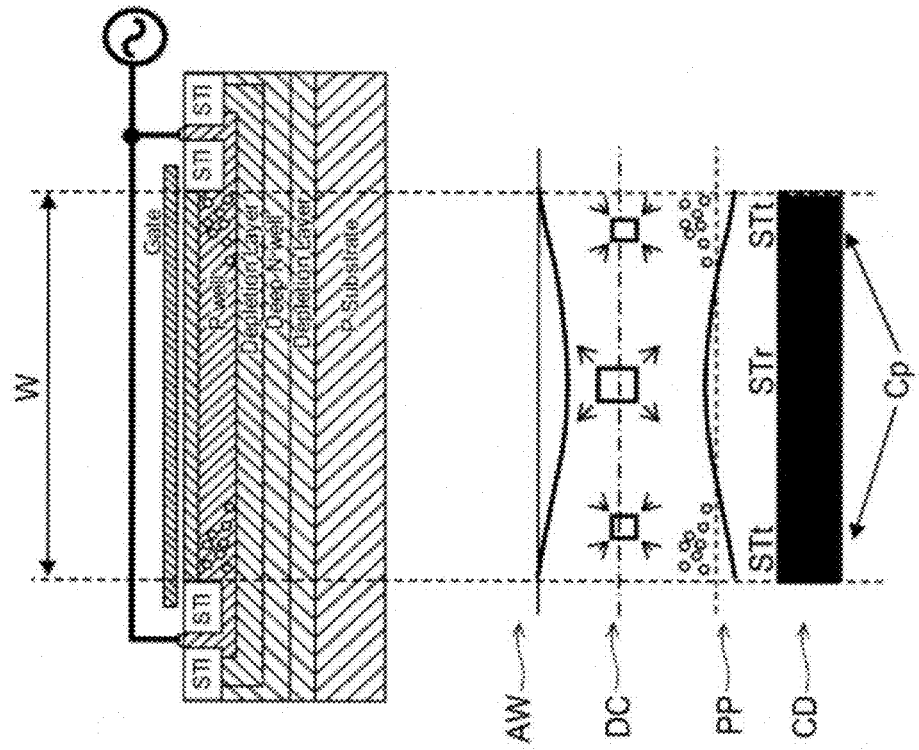
FIG. 20A and FIG. 20B are schematic views illustrating operations of the acoustic semiconductor device according to the second embodiment.
Figure 20B:
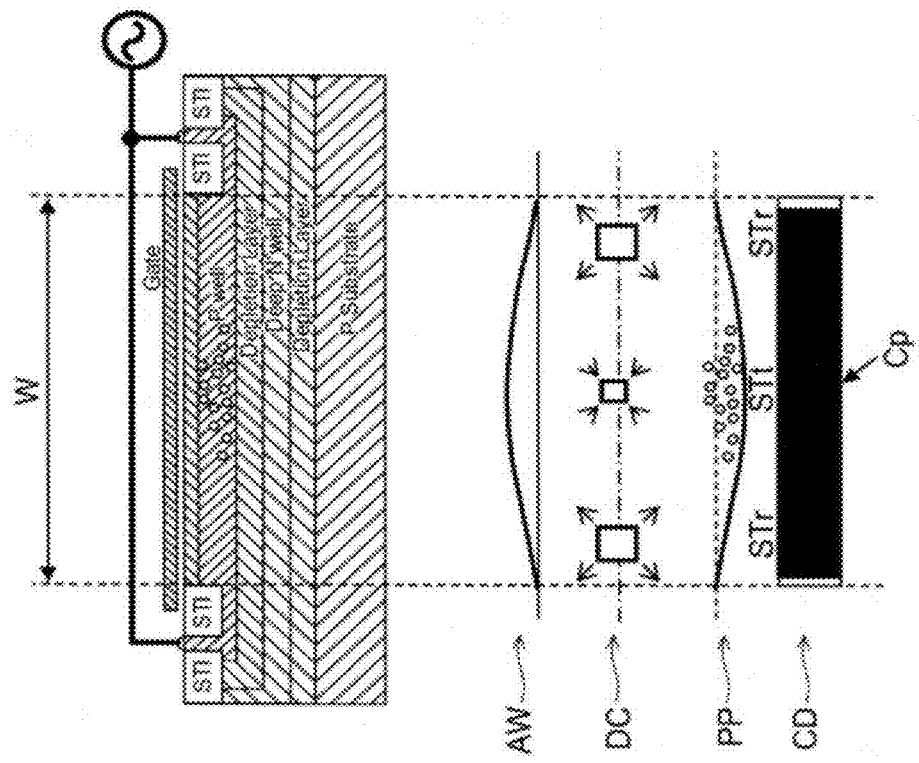

FIG. 20A and FIG. 20B are schematic views illustrating operations of the acoustic semiconductor device according to the second embodiment.

These drawings are model-like illustrations of states of different timing of the acoustic semiconductor device 112 according to the embodiment. These drawings illustrate cross-sectional views of the acoustic semiconductor device 112 and acoustic standing waves.

In the acoustic semiconductor device 112 as illustrated in FIG. 20A and FIG. 20B, an acoustic standing wave (the acoustic wave AW) and an ununiformity of the charge density (e.g., the electron density CD) synchronous with the acoustic standing wave are excited in the element region 12 by applying the direct-current voltage recited above. For example, the deformation of the crystal DC occurs based on the acoustic wave AW; and this is accompanied by, for example, a sparse region STr and a dense region STt forming in the potential energy PP of the electrons. In other words, the charge concentration CP partially occurs.

The probability of the impact ionization in the channel region of the field effect transistor formed in the element region 12 temporally changes synchronously with the period of the acoustic standing wave excited in the element region 12. Because the electron/hole pairs generated by the impact ionization have high energies, a portion thereof reaches the semiconductor substrate (the P-well) as substrate current. Because the periodic change of the P-well current occurs synchronously with the acoustic standing wave, a periodic electrical signal 72 can be detected from the output terminal 19 of the acoustic semiconductor device.

Figure 21:
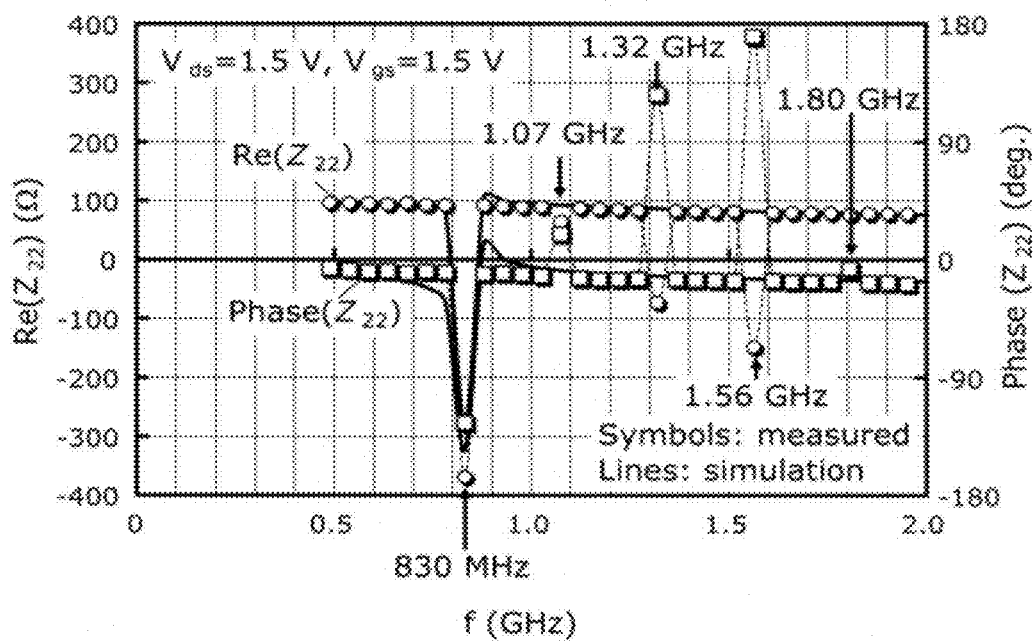
FIG. 21 is a graph illustrating the characteristics of the acoustic semiconductor device according to the second embodiment.

FIG. 21 is a graph illustrating the characteristics of the acoustic semiconductor device according to the second embodiment.

This graph illustrates an example of the results of the impedance measurements of the acoustic semiconductor device 112. Namely, this graph illustrates the measurement results of the frequency dependence of the impedance ($Z_{22}$) as viewed from the drain terminal 17 side of the acoustic semiconductor device 112 using a network analyzer. The horizontal axis illustrates the frequency f. The vertical axis on the left side illustrates the real part Re($Z_{22}$) of the impedance; and the vertical axis on the right side illustrates the phase ($Z_{22}$) of the impedance. In this graph, the round symbols and the square symbols illustrate the actual measured values. The broken lines connect these actual measured values. In FIG. 21, the simulation values using the equivalent circuit are illustrated by the solid line.

In this experimental example as illustrated in FIG. 21, oscillation peaks of the impedance are observed at periodic spacing at 830 MHz, 1.07 GHz, 1.32 GHz, 1.56 GHz, and 1.80 GHz. Thus, it is confirmed by the actual measurements and the simulation that the substrate current oscillates by changing periodically.

The resonance characteristic was evaluated for samples used as the acoustic semiconductor device according to this embodiment in which the sizes of the element regions 12 were different. Here, three types of samples were used. The size (W×$L_{SDG}$) of the element region 12 of one sample was 40 μm×7.18 μm. The size of the element region 12 of one other sample was 40 μm×10.78 μm. The size of the element region 12 of still one other sample was 40 μm×17.98 μm. In other words, in these samples, the widths W of the sizes were the same; and the lengths $L_{SDG}$ were different from each other.

Figure 22:
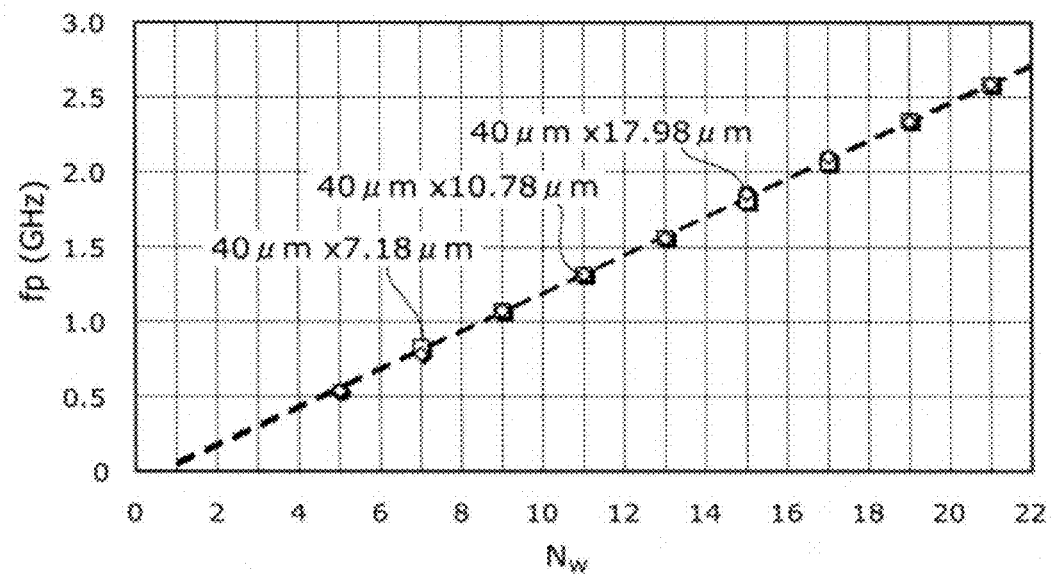
FIG. 22 is a graph illustrating the characteristics of the acoustic semiconductor device according to the second embodiment.

FIG. 22 is a graph illustrating the characteristics of the acoustic semiconductor device according to the second embodiment.

This graph illustrates the measurement results of the resonance characteristics for the three types of acoustic semiconductor devices recited above. The horizontal axis is a wave number $N_W$ (an integer); and the vertical axis denotes the frequency fp of the observed oscillation peaks. In other words, this graph plots by allotting appropriate wave numbers $N_W$ (integers) to the frequency fp of the observed oscillation peaks.

It can be seen from FIG. 22 that an oscillation peak is observed at substantially the same frequency fp for the three samples. Although the length $L_{SDG}$ of the element region 12 (the second length Ly of the second side) is different between these samples, the width W (the first length Lx of the first side) is the same. Therefore, this suggests that an acoustic standing wave having an oscillation peak determined by the width W (Lx) of the configuration of the element region 12 is excited.

Figure 23:
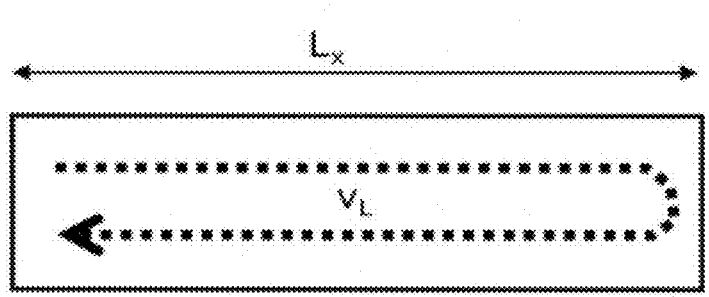
FIG. 23 is a schematic view illustrating operations of the acoustic semiconductor device according to the second embodiment.

FIG. 23 is a schematic view illustrating operations of the acoustic semiconductor device according to the second embodiment.

Namely, this drawing is a model-like illustration of the example of the conditions of the excitation of the acoustic standing wave.

The value of the acoustic velocity $V_L$ propagating through the semiconductor substrate is a property characteristic of the material. As described above in Table 1, for example, $V_L = 8.43 \times 10^5$ cm/s in the case of a longitudinal wave propagating in the (100) direction through a silicon semiconductor monocrystalline substrate.

The acoustic wave actually excited in the element region 12 is not limited to the longitudinal wave; and it is conceivable that different modes are possible. For example, the possibility of an excitation mode in which an interface wave propagates through an interface between the silicon monocrystal and the silicon oxide is conceivable. In such a case, the acoustic velocity $V_L$ can be determined using Formula 9 recited below from the width of the size of the measured element region 12 (Lx=40 μm).

[Formula 9]

$$\frac{2L_X}{N \cdot V_L} = \frac{1}{f_N} \quad (9)$$

$$\frac{f_N}{N} = \frac{V_L}{2L_X}$$

Here, in Formula 9, N is the order of the oscillation; and $f_N$ is the oscillation frequency of the N-th order.

The value of $f_N/N$ of the oscillation frequency per one wave number determined from the measurement results is about 120 MHz. This substantially matches the parallel resonance frequency $f_{pr}$ observed for the frequency characteristic of the impedance measured at the P well.

Figure 24:
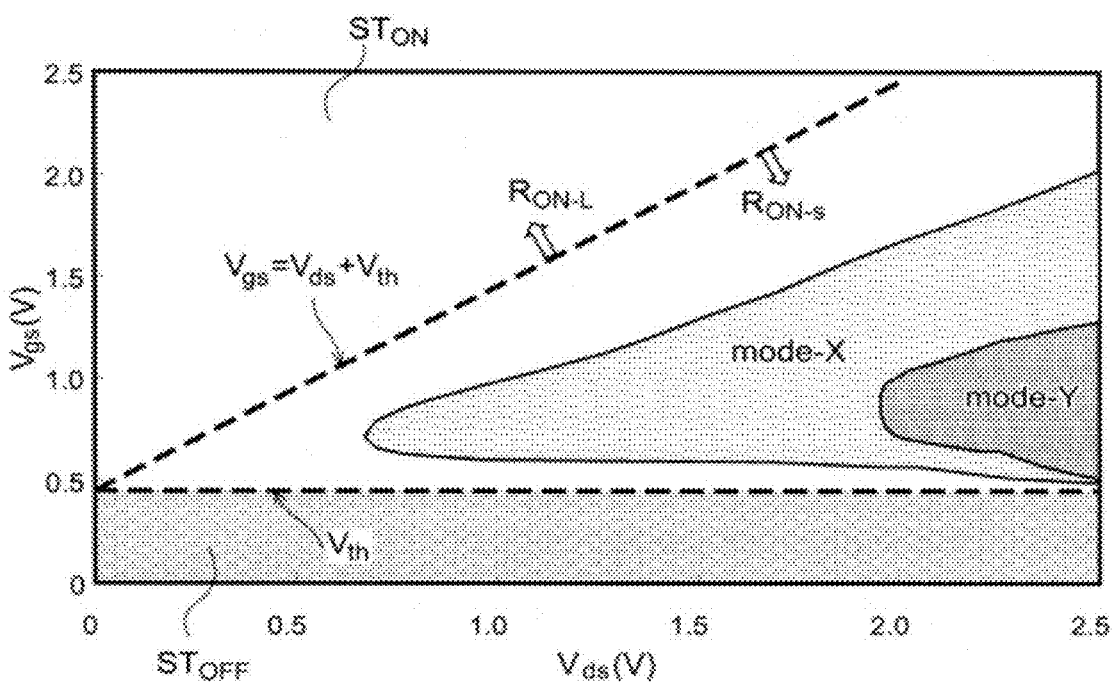
FIG. 24 is a graph illustrating operations of the acoustic semiconductor device according to the second embodiment.

FIG. 24 is a graph illustrating operations of the acoustic semiconductor device according to the second embodiment.

Namely, this graph illustrates an example of the relationship between the applied direct-current voltage and the mode of the self-generated acoustic standing wave of the acoustic semiconductor device 112. The horizontal axis of this graph is the drain voltage $V_{ds}$; and the vertical axis is the gate voltage $V_{gs}$.

As illustrated in FIG. 24, the field effect transistor 100 is in an off-state $ST_{OFF}$ when the gate voltage $V_{gs}$ is lower than the threshold voltage $V_{th}$. At this time, a drain current does not flow in the channel between the drain-source. Accordingly, impact ionization does not occur.

When the gate voltage $V_{gs}$ is higher than the threshold voltage Vth, the state is switched to an on-state $ST_{ON}$.

Although the entire channel region is switched to the on-state and the drain current flows when the gate voltage $V_{gs}$ is in a sufficiently-high linear region $R_{ON-L}$, the impact ionization does not occur because a high electric field is not applied to the electrons flowing through the channel; and the acoustic standing wave is not excited.

When the bias voltage is in a saturation region $R_{ON-S}$ where the drain current of the field effect transistor 100 saturates, a portion of the channel is pinched off. Then, the electrons are accelerated; the impact ionization phenomenon occurs; and electron/hole pairs are generated. Because the electrons have exceedingly high energies and collide against the crystal lattice of the semiconductor, a portion of the energy is converted to the lattice vibration of the crystal at this time. This portion of the energy of the lattice vibration is used to excite the acoustic standing wave in the semiconductor region.

Accordingly, to excite the acoustic standing wave in the acoustic semiconductor device 112 according to this embodiment, the voltage conditions illustrated in Formula 8 recited above are used.

The voltage conditions favorable in practical use are, for example, the conditions of the hatched regions illustrated in FIG. 24 (mode-X and mode-Y). With these conditions, oscillation peaks are reliably observed. These regions are slightly narrower than the region corresponding to Formula 8 recited above.

Because the silicon monocrystal used in the integrated circuit has high purity and has few crystal defects, it is considered that the attenuation due to the propagation of the acoustic wave is relatively small. However, there is a possibility of slight attenuation due to scattering of a portion of the energy of the acoustic wave. Due to the effects of this attenuation, it is conceivable that the range of the conditions of the drain voltage $V_{ds}$ and the gate voltage $V_{gs}$ to excite the standing wave in the element region 12 in the actual observations is narrower than the range of the drain voltage $V_{ds}$ and the gate voltage $V_{gs}$ at which the transistor saturates.

In consideration thereof, it is more favorable for the actual conditions of use to be the conditions of the hatched regions illustrated in FIG. 24.

For the conditions of the first mode (mode-X) of FIG. 24, the acoustic mode is excited in the direction parallel to the extension direction of the gate electrode 16. For the conditions of the second mode (mode-Y) of FIG. 24, it is conceivable that an acoustic mode different from the first mode also may be excited in addition to the first mode (mode-X).

For example, in the case where the acoustic semiconductor device 112 is used as an oscillator, it is favorable to use oscillation conditions in a range in which multiple modes are not excited and a single mode is excited.

In the acoustic semiconductor device 112 according to the embodiment, it is desirable to provide the multiple gate electrodes 16 arranged parallel to each other and connected to each other as illustrated in FIGS. 18A and 18B. It is desirable for the length of the element region 12 along the extension direction of the gate electrodes 16 (the first length Lx, i.e., the width W) to be constant.

As described above, it is suggested that the oscillation peak of the acoustic standing wave depends on the length of the side of the element region 12. Accordingly, it is desirable for the length corresponding to the oscillation frequency of the substrate current (the first length Lx) to be constant such that the acoustic waves occurring under the multiple gate electrodes 16 are acoustic standing waves of the same frequency.

Heat may be generated by the resistance component of the channel when the direct-current voltage applied between the gate electrodes 16 and the drain region is such that a large drain current flows. In the case where the temperature of the channel increases, there is a possibility that the acoustic velocity of the acoustic wave propagating through the semiconductor crystal may change; and the oscillation frequency may fluctuate. Accordingly, from the aspect of suppressing the heat generation and stabilizing the oscillation frequency, it is desirable for the voltage applied to the gate electrodes 16 to be low.

Because the acoustic semiconductor device 112 according to the embodiment has a field effect transistor configuration, integration with other electronic circuits is easy.

According to the embodiment, a semiconductor device can be provided that functions as an oscillator having frequency accuracy higher than that of a conventional oscillator integrated with an electronic circuit.

For example, according to the embodiment, the temperature dependence of the oscillation frequency can be less than that of a ring oscillator that uses an inverter, etc. In a ring oscillator, the oscillation frequency of the transistor depends on the drain current; and the change of the drain current due to the temperature is greater than the change of the acoustic velocity of the acoustic wave due to the temperature. In the embodiment, the change of the drain current amount does not directly affect the oscillation frequency. Therefore, in the embodiment, the temperature dependence of the oscillation frequency is low.

According to the embodiment, the patterning dimension dependence of the oscillation frequency also is lower than that of a ring oscillator using an inverter, etc. The drain current of the transistor depends on the precision of the gate length; and this drain current in the ring oscillator, etc., affects the oscillation frequency. Accordingly, the oscillation frequency depends on the patterning precision of the gate length of the transistor.

Conversely, in the embodiment, the oscillation frequency depends on the length of the side of the element region. For example, in the first mode (mode-X) recited above, the oscillation frequency depends on the gate width of the transistor. Normally, the gate width of the transistor is designed to be not less than 10 times the gate length and not more than 100 times the gate length. Therefore, even in the case where the patterning fluctuates by the same amount, the proportion of the fluctuation of the gate width is less than the proportion of the fluctuation of the gate length. Accordingly, in the embodiment, the patterning dimension dependence of the oscillation frequency is lower than that of conventional art.

Thus, the acoustic semiconductor device 112 according to this embodiment includes a second terminal to control the oscillation frequency. The second terminal includes at least one selected from the gate terminal 32, the source terminal 18, the drain terminal 17, and a terminal electrically connected to the semiconductor layer 11 (e.g., the output terminal 19).

In other words, the second terminal may include a terminal electrically connected to one selected from the first impurity diffusion portion 12a, the second impurity diffusion portion 12b, the intermediate portion 12c, and the gate electrode 16. The second terminal is not electrically connected to, for example, the first terminal 160.

The second terminal may be electrically connected to the semiconductor crystal resonance layer with an interposed insulating layer provided on the side surface of the semiconductor crystal resonance layer.

The second terminal may be electrically connected to a layer provided on the side surface of the semiconductor crystal resonance layer and including a semiconductor crystal of a conductivity type different from the conductivity type of the semiconductor crystal resonance layer.

At least one selected from the density and the drift velocity of a conduction carrier propagating through the acoustic resonance unit 155 changes according to the signal input to the second terminal, where the conduction carrier is at least one selected from an electron and a hole. Thereby, the velocity of the acoustic wave propagating through the acoustic resonance unit 155 changes.

The signal input to the second terminal is, for example, a direct-current bias voltage.

Thus, the acoustic semiconductor device according to this embodiment includes a semiconductor substrate, an acoustic resonator (the acoustic resonance unit 155) formed in a specific region inside the semiconductor substrate and configured to excite an acoustic standing wave, and the first terminal 160 configured to output an electrical oscillation signal that is synchronous with the resonant frequency of the acoustic resonator. The propagation velocity of the acoustic wave is electrically changed by controlling at least one selected from the density and the drift velocity of a conduction carrier propagating through the acoustic resonator using an acoustic wave/electron interaction, where the conduction carrier is at least one selected from an electron and a hole.

The element region 12, for example, may be used as the specific region on the semiconductor substrate to excite the acoustic standing wave, where the element-separating region 13 (e.g., a buried insulating layer) formed on the semiconductor substrate is provided around the element region 12.

Specifically, the configuration to excite the acoustic standing wave in the specific region on the semiconductor substrate and output the electrical oscillation signal that is synchronous with the resonant frequency may include a field effect transistor and a terminal. Such a field effect transistor includes the gate electrode 16 formed on the element region 12, the source/drain region 15 provided in the element region 12 on both sides of the gate electrode 16, and the channel region provided in the element region 12 between the source/drain region 15. The terminal includes, for example, at least one selected from a gate terminal connected to the gate electrode 16, the source terminal 18 and the drain terminal 17 connected to the source/drain region 15, and a substrate terminal (e.g., the output terminal 19) adjacent to the channel region with an interposed depletion layer.

In the acoustic semiconductor device 112 according to this embodiment, the source/drain region 15 is provided in the interior of the well structure formed inside the semiconductor substrate.

The acoustic semiconductor device 112 according to this embodiment functions as an oscillator by outputting at least one selected from a drain voltage, a drain current, a substrate voltage, and a substrate current that vibrates synchronously with the acoustic standing wave excited in the specific region.

Figure 25:
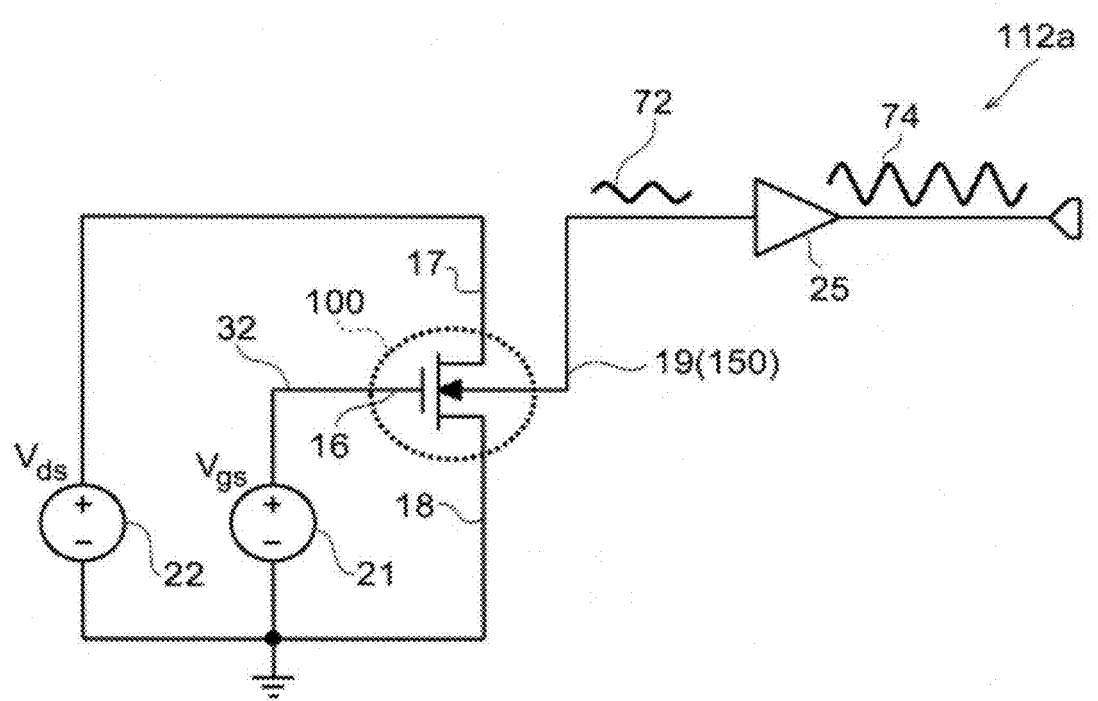
FIG. 25 is a schematic view illustrating another acoustic semiconductor device according to the second embodiment.

FIG. 25 is a schematic view illustrating the configuration of another acoustic semiconductor device according to the second embodiment. Namely, this drawing is an equivalent circuit diagram of the acoustic semiconductor device 112a according to this embodiment.

In addition to the acoustic semiconductor device 112 described above, the acoustic semiconductor device 112a further includes an amplifier 25 (an amplifier circuit unit) as illustrated in FIG. 25. The amplifier 25 is connected to the output terminal 19.

For example, an electronic circuit based on a transistor such as a single amplifier circuit, a push-pull amplifier circuit, a subtractor circuit, etc., can be used as the amplifier 25.

According to the acoustic semiconductor device 112a, even in the case where the oscillating substrate current is faint, the electrical signal 72 can be amplified; and an electrical signal 74 having amplitude larger than the amplitude of the electrical signal 72 can be obtained.

Thus, the acoustic semiconductor device 112a according to this embodiment further includes an amplifier circuit (the amplifier 25) configured to amplify the amplitude strength of the oscillation signal output from at least one selected from the gate terminal, the source terminal, the drain terminal, and the base terminal (the substrate terminal or the well terminal) of the field effect transistor. The amplifier circuit may be provided on a portion of the semiconductor layer (e.g., the semiconductor substrate) in which the field effect transistor recited above is provided.

In other words, the acoustic semiconductor device 112a further includes an amplifier circuit unit (the amplifier 25) provided on a base body (in this example, the p-type substrate 11*a*) in which the semiconductor crystal resonance layer (the element region 12) is provided. The electrical signal synchronous with the acoustic standing wave is output from the acoustic resonance unit 155 via the first terminal 160. The amplifier circuit unit amplifies the electrical signal output from the first terminal 160.

Third Embodiment

Figure 26A:
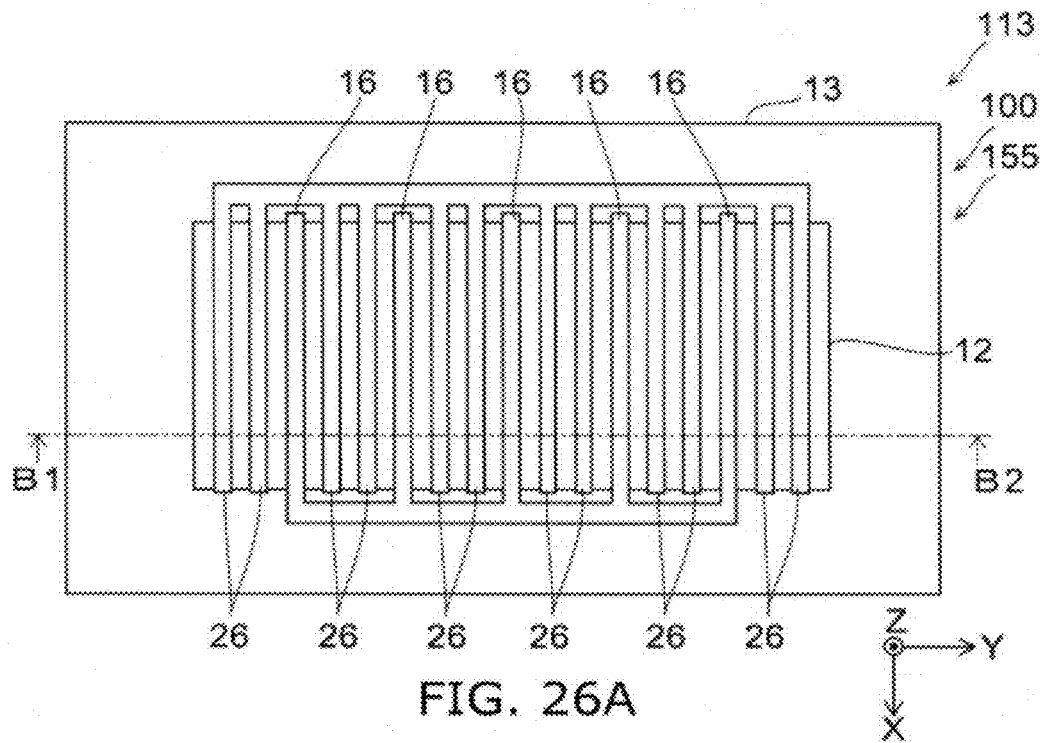
FIG. 26A and FIG. 26B are schematic views illustrating an acoustic semiconductor device according to the third embodiment.
Figure 26B:
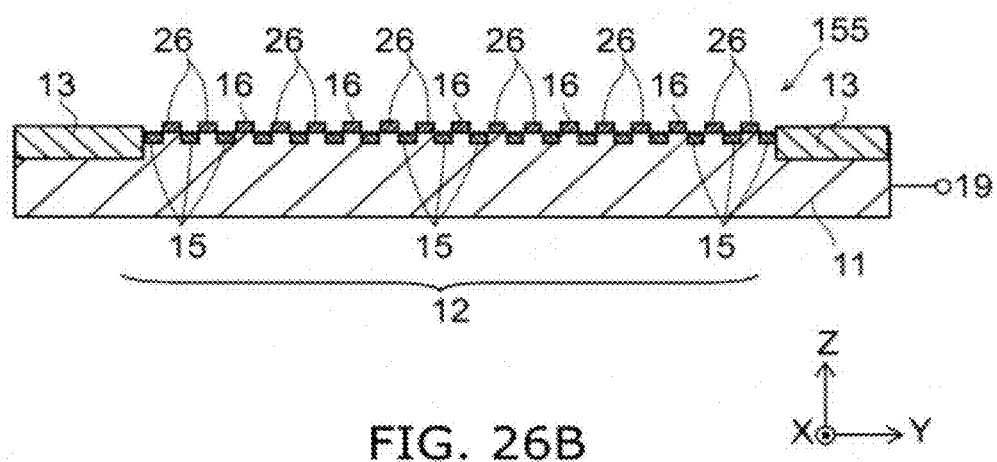

FIG. 26A and FIG. 26B are schematic views illustrating the configuration of an acoustic semiconductor device according to the third embodiment.

FIG. 26A is a plan view. FIG. 26B is a cross-sectional view along line B1-B2 of FIG. 26A.

As illustrated in FIG. 26A and FIG. 26B, an inter-gate electrode 26 is further provided in the acoustic semiconductor device 113 according to this embodiment. The inter-gate electrode 26 is provided between the multiple gate electrodes 16. In other words, the inter-gate electrode 26 is provided on the channel region between the multiple gate electrodes 16. The inter-gate electrode 26 extends along the extension axis of the gate electrode 16. The inter-gate electrode 26 is, for example, a dummy gate electrode. Otherwise, the configuration is similar to that of the acoustic semiconductor device 112. A description is omitted for details duplicate to those of the second embodiment.

In the acoustic semiconductor device 113, for example, the multiple inter-gate electrodes 26 are disposed between the gate electrode 16 and the gate electrode 16. The inter-gate electrodes 26 are connected to, for example, a grounding potential without being connected to a direct-current voltage source. Thereby, the dispositions of the heat sources occurring due to the resistance component of the channel region can be dispersed. Thereby, the temperature increase caused by the field effect transistor 100 can be suppressed.

In the case where the temperature of the channel region increases, the acoustic velocity of the acoustic wave propagating through the semiconductor crystal changes; and there is a possibility that the oscillation frequency may fluctuate. At this time, according to the acoustic semiconductor device 113, the oscillation frequency is stabilized because the temperature increase due to the heat generation is suppressed. Thereby, an acoustic semiconductor device that is favorable when applied as an oscillator can be realized.

Fourth Embodiment

Figure 27A:
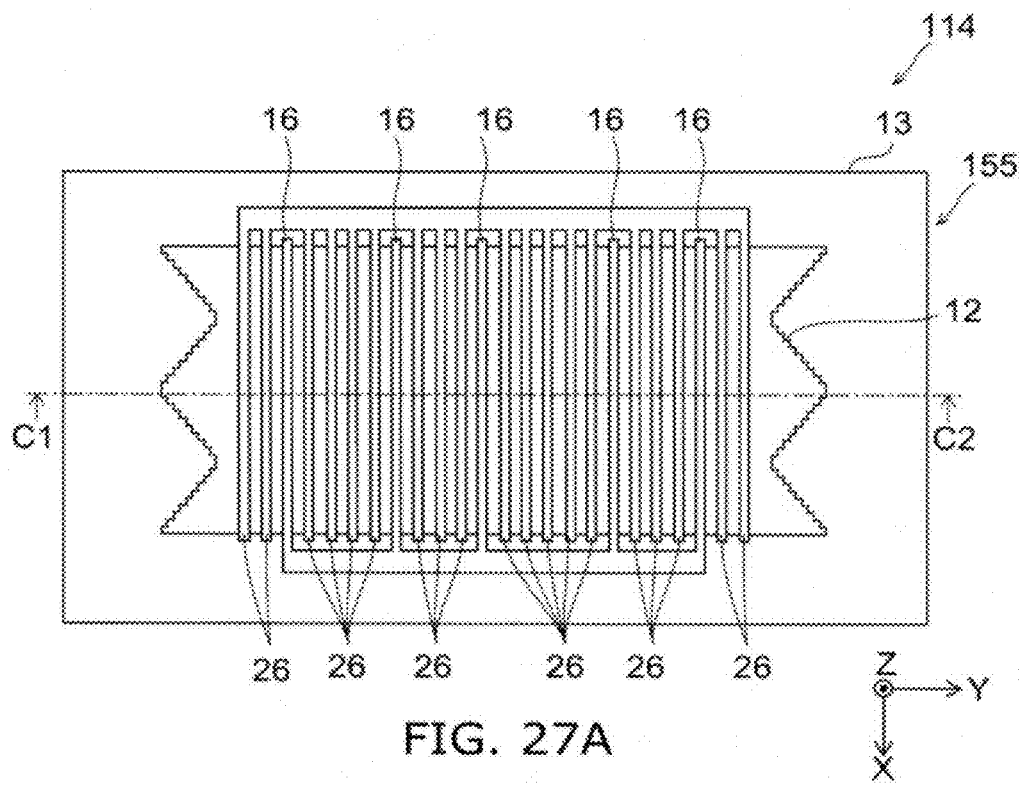
FIG. 27A and FIG. 27B are schematic views illustrating an acoustic semiconductor device according to the fourth embodiment.
Figure 27B:
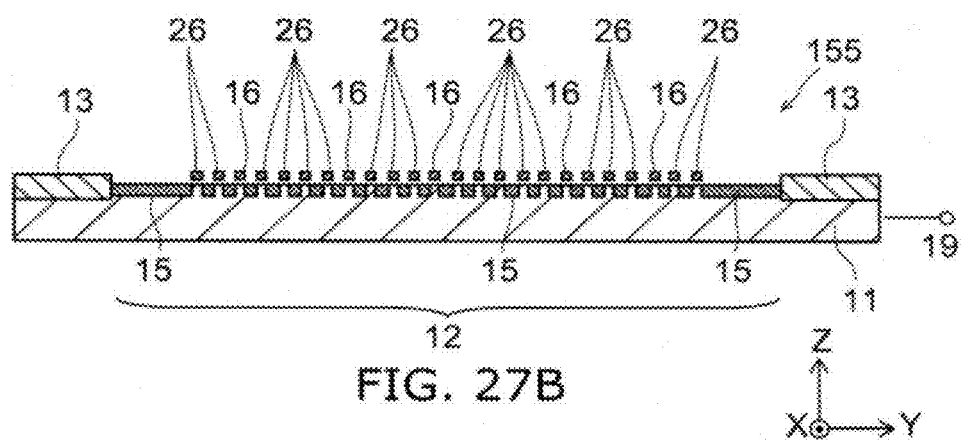

FIG. 27A and FIG. 27B are schematic views illustrating the configuration of an acoustic semiconductor device according to the fourth embodiment.

FIG. 27A is the plan view. FIG. 27B is the cross-sectional view along line C1-C2 of FIG. 27A.

In the acoustic semiconductor device 114 according to this embodiment as illustrated in FIG. 27A and FIG. 27B, the number of the inter-gate electrodes 26 provided between the gate electrodes 16 is not constant and is changing. Further, the configuration of the element region 12 is different from that of the acoustic semiconductor device 113. Otherwise, the acoustic semiconductor device 114 is the same as the acoustic semiconductor device 113. A description is omitted for details duplicate to those of the third embodiment.

Although the acoustic semiconductor device 114 is similar to that of the third embodiment in that the multiple inter-gate electrodes 26 are disposed between the gate electrode 16 and the gate electrode 16, the number of the inter-gate electrodes 26 between the gate electrodes 16 is not constant and is mutually different.

For example, the multiple gate electrodes 16 include a first electrode being one of the multiple gate electrodes 16, a second electrode next to the first electrode of the multiple gate electrodes 16, a third electrode being one of the plurality of electrodes other than the first electrode and the second electrode, and a fourth electrode next to the third electrode of the plurality of electrodes. A number of the inter-gate electrode provided between the first electrode and the second electrode is different from a number of the inter-gate electrode provided between the third electrode and the fourth electrode.

Also, the configuration of the element region 12 is not rectangular. The sides of the element region 12 that do not intersect the gate electrode 16 are tilted (in this case, tilted in a stairstep configuration). Thereby, the length of the element region 12 along the axis (the Y-axis) perpendicular to the extension axis of the gate electrodes 16 is not constant. That is, a length of the element region 12 along the Y-axis changes along the X-axis perpendicular to the Y-axis. Thereby, the excitation of the acoustic standing wave along the axis (the Y-axis) perpendicular to the extension axis of the gate electrodes 16 can be suppressed.

Thereby, the acoustic standing wave of a single mode is excited. Thereby, an acoustic semiconductor device that is favorable when applied as an oscillator can be provided.

Fifth Embodiment

Figure 28:
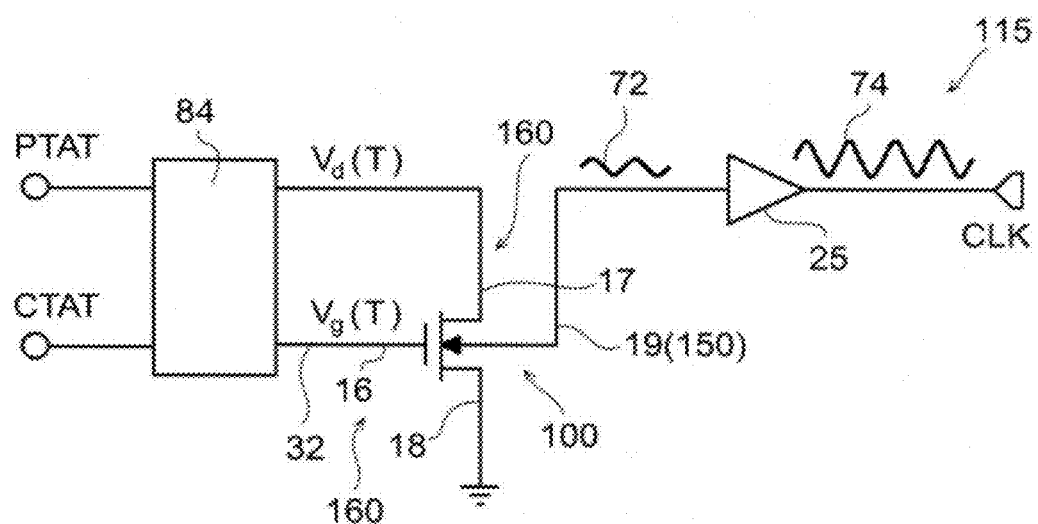
FIG. 28 is a schematic view illustrating an acoustic semiconductor device according to the fifth embodiment.

FIG. 28 is a schematic view illustrating the configuration of an acoustic semiconductor device according to the fifth embodiment.

In addition to the field effect transistor 100, the acoustic semiconductor device 115 according to this embodiment further includes a temperature compensation circuit 84 as illustrated in FIG. 28. The temperature compensation circuit 84 may include, for example, an open-loop temperature compensation circuit. The temperature compensation circuit 84 is configured to output an electrical signal corresponding to the environment temperature to the first terminal 160.

In the acoustic semiconductor device 115, the temperature compensation circuit 84 is connected to, for example, the gate electrode 16 and the drain terminal 17 of the field effect transistor 100. A current source proportional to absolute temperature (a PTAT current source) and a current source complementary to absolute temperature (a CTAT current source) are connected to the temperature compensation circuit 84. Thereby, a temperature-dependent compensation drain voltage source $V_d(T)$ and a temperature-dependent compensation gate voltage source $V_g(T)$ are constructed.

For example, these voltages are supplied to the drain terminal 17 and the gate terminal 32 of the acoustic semiconductor device 114 recited above (the semiconductor device in which the acoustic standing wave of the single mode is excited by suppressing the excitation of the acoustic standing wave along the axis (the Y-axis) perpendicular to the extension axis of the gate electrode 16).

The density of the conduction carrier propagating through the acoustic resonator is controlled by the temperature-dependent compensation gate voltage source $V_g(T)$ supplied to the gate terminal 32, where the conduction carrier is at least one selected from an electron and a hole.

The drift velocity of the conduction carrier propagating through the acoustic resonator is controlled by the temperature-dependent compensation drain voltage source $V_d(T)$ supplied to the drain terminal 17, where the conduction carrier is at least one selected from an electron and a hole.

Thereby, the velocity of the acoustic wave propagating through the semiconductor can be electrically changed by utilizing the interaction between the electrons and the phonons. Thereby, an oscillation frequency having improved temperature dependence can be obtained.

Thus, the semiconductor device according to the embodiment includes a mechanism to couple the charge and the acoustic wave propagating through the semiconductor crystal.

The acoustic semiconductor device according to the embodiment includes, for example, a semiconductor substrate, a unit configured to excite the acoustic wave in the specific region inside the semiconductor substrate, and an electric terminal configured to input/output the electrical signal that fluctuates synchronously with the period of the acoustic wave.

The acoustic semiconductor device according to the embodiment includes, for example, a semiconductor substrate, an acoustic resonator formed in the specific region inside the semiconductor substrate and configured to excite the acoustic standing wave, and a terminal configured to input/output the electrical signal that is synchronous with the resonant frequency of the acoustic resonator.

In the acoustic semiconductor device according to the embodiment, a resonator configured to excite the acoustic standing wave in the specific crystal region of the semiconductor substrate is formed. Such an acoustic resonator may be realized by subdividing a portion of the semiconductor substrate using the element-separating unit 13s of a material having an acoustic impedance different from that of the resonator. For example, in the case where the crystal of the semiconductor is Si, the element-separating unit 13s may include, for example, a $SiO_2$ layer, a hollow layer, etc. For example, the acoustic standing wave may be excited in a region (the element region 12) having the element-separating region 13, i.e., the buried insulating layer, formed therearound on the semiconductor substrate.

To efficiently couple the acoustic wave and the movement of the charge, it is favorable for an electrical path to be provided such that the charge can move in the same direction as the direction in which the acoustic standing wave is excited and propagated. Thus, in the case where the acoustic standing wave is excited and coupled to the charge, the equivalent-circuit operation of the element operates as a resonator.

The acoustic semiconductor device according to the embodiment further includes, for example, a control mechanism that can change the velocity of the acoustic wave propagating through the semiconductor by controlling the density and the drift velocity of a conduction carrier propagating through the acoustic resonator, where the conduction carrier is at least one selected from an electron and a hole. Thereby, at least one selected from the equivalent inductance and the resonant frequency can be controlled because the velocity of the acoustic wave propagating through the semiconductor can be changed.

For example, a configuration to apply a direct-current bias voltage to the terminal recited above that inputs/outputs the electrical signal can be used as the control mechanism. Also, a configuration to apply a direct-current bias voltage to a layer provided adjacent to the acoustic resonator recited above and being of a conductivity type opposite to the conductivity type of the acoustic resonator can be used as the control mechanism. A configuration to apply a direct-current bias voltage to an electrode juxtaposed with the acoustic resonator recited above with a thin insulating film interposed can be used as the control mechanism.

The acoustic semiconductor device according to the embodiment can be utilized as an oscillator. Generally, in an oscillator using an acoustic resonator, the resonant frequency is changed using a method for at least one selected from changing the size of the resonator to change the oscillation frequency and changing the velocity of the acoustic wave propagating through the medium. Conversely, in the acoustic semiconductor device according to the embodiment, the velocity of the acoustic wave propagating through the semiconductor is electrically controlled. That is, in the embodiment, for example, a frequency of the acoustic standing wave is controllable by a voltage applied to the electrode 16.

The acoustic semiconductor device according to the embodiment may further include a circuit to correct the frequency error occurring in the manufacturing processes of the acoustic semiconductor device by utilizing the frequency control mechanisms recited above. Thereby, the frequency error occurring due to the fluctuation of the manufacturing processes can be corrected; and a frequency having high accuracy can be obtained.

A temperature compensation circuit configured to maintain the oscillation frequency at a constant for a changing environment temperature can be further included by utilizing the frequency control mechanism recited above. Thereby, a frequency having high accuracy that is stable when the temperature changes is obtained.

An n-type MOS transistor (an n-type MIS transistor) that uses electrons as carriers and a p-type MOS transistor (a p-type MIS transistor) that uses holes as carriers can be used in any of the embodiments recited above.

Although a configuration is described in the embodiments recited above in which the element region 12 and the field effect transistor 100 inside the element region 12 are formed on the semiconductor substrate, the embodiments are not limited thereto. For example, it is also possible to form the element region 12 and the field effect transistor 100 inside the element region 12 in a well of a conductivity type different from that of the substrate provided inside the semiconductor substrate. In such a case, the electrical signal synchronous with the acoustic standing wave can be detected by an output terminal connected to the well in which the channel region exists.

According to the embodiments, for example, an inductor that can be easily formed on a semiconductor substrate and has a large inductance that had been difficult to realize conventionally with a spiral inductor can be provided. For example, a resonant circuit having a large inductance component can be realized. For example, because the inductance component is acoustically realized on the semiconductor substrate, coupling by an electromagnetic field does not occur easily with other portions of the circuit; and an inductance element that does not act as a noise source can be provided.

According to the embodiments, an acoustic semiconductor device that realizes a novel inductor element having a large inductance is provided.

In the specification of the application, "perpendicular" and "parallel" refer to not only strictly perpendicular and strictly parallel but also include, for example, the fluctuation due to manufacturing processes, etc. It is sufficient to be substantially perpendicular and substantially parallel.

Hereinabove, several embodiments of the invention are described with reference to specific examples. However, the embodiments of the invention are not limited to these specific examples. For example, one skilled in the art may similarly practice the invention by appropriately selecting specific configurations of components included in acoustic semiconductor devices such as element units, terminals, transistors, impurity diffusion portions, intermediate portions, electrodes, amplifier circuit units, temperature control circuits, etc., from known art. Such practice is included in the scope of the invention to the extent that similar effects thereto are obtained.

Further, any two or more components of the specific examples may be combined within the extent of technical feasibility and are included in the scope of the invention to the extent that the purport of the invention is included.

Moreover, all acoustic semiconductor devices practicable by an appropriate design modification by one skilled in the art based on the acoustic semiconductor devices described above as embodiments of the invention also are within the scope of the invention to the extent that the purport of the invention is included.

Various other variations and modifications can be conceived by those skilled in the art within the spirit of the invention, and it is understood that such variations and modifications are also encompassed within the scope of the invention.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. An acoustic semiconductor device, comprising:
an element unit including an acoustic resonance unit, the acoustic resonance unit including a semiconductor crystal, an acoustic standing wave being excitable in the acoustic resonance unit and being configured to be synchronously coupled with electric charge density within at least one portion of the semiconductor crystal via a deformation-potential coupling effect; and
a first terminal electrically connected to the element unit, at least one selected from outputting and inputting an electrical signal being implementable via the first terminal, the electrical signal being coupled with the electric charge density, the outputting the electrical signal being from the acoustic resonance unit, the inputting the electrical signal being into the acoustic resonance unit;
wherein the acoustic resonance unit includes:
a base body on which the semiconductor crystal is disposed;
an element-separating unit provided on the base body; and
a semiconductor crystal resonance layer being provided on the base body and including a part of the semiconductor crystal,
a side surface of the semiconductor crystal resonance layer being in contact with the element-separating unit, and
an acoustic impedance of the element-separating unit being different from an acoustic impedance of the semiconductor crystal resonance layer.

2. The device according to claim 1, wherein the element-separating unit includes at least one selected from an insulating layer and a hollow layer.

3. The device according to claim 2, wherein the semiconductor crystal resonance layer is surrounded by the element-separating unit.

4. The device according to claim 1, wherein
the semiconductor crystal resonance layer has a first impurity diffusion portion, a second impurity diffusion portion, and an intermediate portion provided between the first impurity diffusion portion and the second impurity diffusion portion,
the element unit includes an electrode provided on the intermediate portion, and
the first terminal is electrically connected to at least one selected from the first impurity diffusion portion, the second impurity diffusion portion, the intermediate portion, and the electrode.

5. The device according to claim 4, further comprising a second terminal electrically connected to one selected from the first impurity diffusion portion, the second impurity diffusion portion, the intermediate portion, and the electrode,
a velocity of an acoustic wave propagating through the acoustic resonance unit being changed according to a signal input to the second terminal by changing at least one selected from a density and a drift velocity of a conduction carrier propagating through the acoustic resonance unit, the conduction carrier being at least one selected from an electron and a hole.

6. The device according to claim 5, wherein the signal input to the second terminal is a direct-current bias voltage.

7. The device according to claim 4, further comprising a temperature compensation circuit configured to output an electrical signal to the second terminal, the electrical signal corresponding to an environment temperature.

8. The device according to claim 1, further comprising a second terminal,
the second terminal being
electrically connected to the semiconductor crystal resonance layer with an interposed insulating layer provided on a side surface of the semiconductor crystal resonance layer, or
electrically connected to a layer provided on a side surface of the semiconductor crystal resonance layer, the layer including a semiconductor crystal having a conductivity type different from a conductivity type of the semiconductor crystal resonance layer,
a velocity of an acoustic wave propagating through the acoustic resonance unit being changed according to a signal input to the second terminal by changing at least one selected from a density and a drift velocity of a conduction carrier propagating through the acoustic resonance unit, the conduction carrier being at least one selected from an electron and a hole.

9. The device according to claim 8, wherein the signal input to the second terminal is a direct-current bias voltage.

10. The device according to claim 8, wherein the second terminal is not electrically connected to the first terminal.

11. The device according to claim 8, further comprising a temperature compensation circuit configured to output an electrical signal to the second terminal, the electrical signal corresponding to an environment temperature.

12. The device according to claim 1, further comprising an amplifier circuit unit provided on the base body to connect to the first terminal,
the electrical signal synchronous with the acoustic standing wave being output from the acoustic resonance unit via the first terminal, and
the amplifier circuit unit being configured to amplify the electrical signal output from the first terminal.

13. The device according to claim 4, wherein
the electrode is multiply provided, and
extension directions of the plurality of electrodes are parallel to each other.

14. The device according to claim 4, wherein
the electrode is multiply provided, and the element unit further includes an inter-gate electrode provided between the plurality of electrodes.

15. The device according to claim 14, wherein the plurality of electrodes extend along a first direction, and the inter-gate electrode extends along the first direction.

16. The device according to claim 14, wherein the inter-gate electrode is set to a grounding potential.

17. The device according to claim 14, wherein the plurality of electrodes include
- a first electrode being one of the plurality of electrodes,
- a second electrode next to the first electrode, the second electrode being one of the plurality of electrodes,
- a third electrode being one of the plurality of electrodes other than the first electrode and the second electrode,
- a fourth electrode next to the third electrode, the fourth electrode being one of the plurality of electrodes, a number of the inter-gate electrode provided between the first electrode and the second electrode is different from a number of the inter-gate electrode provided between the third electrode and the fourth electrode.

18. The device according to claim 4, wherein a length of the semiconductor crystal resonance layer along a first axis changes along a direction perpendicular to the first axis, the first axis being perpendicular to an extension axis of the electrode.

19. The device according to claim 1, wherein the electrical signal is coupled with the electric charge density through at least one selected from a dynamical outputting of electric charge and a dynamical inputting of electric charge between the first terminal and the semiconductor crystal.

\* \* \* \* \*